（12） United States Patent
Nakabayashi et al.

(10) Patent No.: US 10,854,790 B2
(45) Date of Patent: Dec. 1, 2020

(54) LIGHT EMITTING DEVICE HAVING MULTIPLE LIGHT EMITTING ELEMENTS

(71) Applicant: NICHIA CORPORATION, Anan (JP)

(72) Inventors: Takuya Nakabayashi, Tokushima (JP); Tadaaki Ikeda, Anan (JP); Toru Hashimoto, Tokushima (JP); Yukiko Yokote, Anan (JP)

(73) Assignee: NICHIA CORPORATION, Anan (JP)

( * ) Notice: Subject to any disclaimer, the term of this patent is extended or adjusted under 35 U.S.C. 154(b) by 41 days.

(21) Appl. No.: 16/229,409

(22) Filed: Dec. 21, 2018

(65) Prior Publication Data

US 2019/0198722 A1    Jun. 27, 2019

(30) Foreign Application Priority Data

Dec. 22, 2017 (JP) ................. 2017-246293

(51) Int. Cl.
*H01L 33/50* (2010.01)
*H01L 25/075* (2006.01)
(Continued)

(52) U.S. Cl.
CPC .......... *H01L 33/502* (2013.01); *C09K 11/617* (2013.01); *H01L 25/0753* (2013.01); (Continued)

(58) Field of Classification Search
CPC ... H01L 33/502; H01L 25/0753; H01L 33/58; H01L 33/62; H01L 33/647; H01L 33/60;
(Continued)

(56) References Cited

U.S. PATENT DOCUMENTS

| 10,418,533 B2 * | 9/2019 | Abe ................. H01L 33/56 |
| 2007/0126011 A1 | 6/2007 | Lee |

(Continued)

FOREIGN PATENT DOCUMENTS

| JP | 2007-067204 A | 3/2007 |
| JP | 2007-158296 A | 6/2007 |

(Continued)

*Primary Examiner* — Alexander O Williams
(74) *Attorney, Agent, or Firm* — Hunton Andrews Kurth LLP

(57) ABSTRACT

A light emitting device includes a first light emitting element including a rectangular first light extraction surface, a second light emitting element including a rectangular second light extraction surface and emitting light having an emission peak wavelength different from an emission peak wavelength of the first light emitting element, and a light-transmissive member covering the first light extraction surface and the second light extraction surface. The light-transmissive member includes a first light-transmissive layer facing the first light extraction surface and the second light extraction surface, a wavelength conversion layer located on the first light-transmissive layer, and a second light-transmissive layer located on the wavelength conversion layer. The first light-transmissive layer contains a first matrix and first diffusive particles. The wavelength conversion layer contains a second matrix and wavelength conversion particles. The second light-transmissive layer contains a third matrix and second diffusive particles.

15 Claims, 13 Drawing Sheets

(51) Int. Cl.
*H01L 33/58* (2010.01)
*H01L 33/62* (2010.01)
*H01L 33/64* (2010.01)
*C09K 11/61* (2006.01)
*H01L 33/60* (2010.01)

(52) U.S. Cl.
CPC ............. *H01L 33/58* (2013.01); *H01L 33/60* (2013.01); *H01L 33/62* (2013.01); *H01L 33/647* (2013.01); *H01L 2933/0091* (2013.01)

(58) Field of Classification Search
CPC ..... H01L 25/075; H01L 33/64; C09K 11/617; C09K 11/61
USPC .......................................................... 257/88
See application file for complete search history.

(56) References Cited

U.S. PATENT DOCUMENTS

| | | | |
|---|---|---|---|
| 2012/0146077 A1* | 6/2012 | Nakatsu | H01L 33/486 257/98 |
| 2013/0033169 A1 | 2/2013 | Ito et al. | |
| 2013/0037847 A1* | 2/2013 | Sugiura | H01L 33/642 257/99 |
| 2013/0221389 A1 | 8/2013 | Yamamuro | |
| 2015/0311406 A1 | 10/2015 | Lange et al. | |
| 2016/0190409 A1* | 6/2016 | Kuo | H01L 33/507 257/98 |
| 2017/0294561 A1* | 10/2017 | Ikeda | C08K 3/34 |
| 2017/0345982 A1* | 11/2017 | Abe | H01L 33/62 |
| 2018/0080641 A1* | 3/2018 | Tanaka | G02F 1/1335 |
| 2019/0097094 A1* | 3/2019 | Han | G02B 5/0205 |
| 2019/0198738 A1* | 6/2019 | Nakabayashi | H01L 33/60 |
| 2019/0237634 A1* | 8/2019 | Nakabayashi | H01L 33/58 |
| 2020/0035874 A1* | 1/2020 | Nakabayashi | H01L 25/0753 |
| 2020/0044115 A1* | 2/2020 | Hashimoto | H01L 24/02 |
| 2020/0044129 A1* | 2/2020 | Hashimoto | H01L 33/36 |
| 2020/0083421 A1* | 3/2020 | Nakabayashi | H01L 33/62 |

FOREIGN PATENT DOCUMENTS

| | | |
|---|---|---|
| JP | 2013-038187 A | 2/2013 |
| JP | 2013-175531 A | 9/2013 |
| JP | 2014-120660 A | 6/2014 |
| JP | 2015-173287 | * 10/2015 |

* cited by examiner

LIGHT EMITTING DEVICE HAVING MULTIPLE LIGHT EMITTING ELEMENTS

CROSS-REFERENCE TO RELATED APPLICATION

This application claims priority to Japanese Patent Application No. 2017-246293, filed on Dec. 22, 2017, the disclosure of which is hereby incorporated by reference in its entirety.

BACKGROUND

The present disclosure relates to a light emitting device.

A white light emitting diode is known in which a blue light emitting diode chip and a green light emitting diode chip are mounted on a first lead terminal, the blue light emitting diode chip and the green light emitting diode chip are encapsulated in a molded portion, and a red phosphor is contained in the molded portion (see, for example, Japanese Patent Publication No. 2007-158296).

SUMMARY

Certain non-limiting and exemplary embodiment provides a light emitting device in which the color non-uniformity is less likely to occur.

In certain general aspect, a light emitting device according to the present disclosure includes a first light emitting element including a rectangular first light extraction surface, a first electrodes formation surface located opposite to the first light extraction surface, a first lateral surface located between the first light extraction surface and the first electrodes formation surface, and a pair of first electrodes formed on the first electrodes formation surface;

a second light emitting element including a rectangular second light extraction surface, a second electrodes formation surface located opposite to the second light extraction surface, a second lateral surface located between the second light extraction surface and the second electrodes formation surface, and a pair of second electrodes formed on the second electrodes formation surface, the second light emitting element emitting light having an emission peak wavelength different from an emission peak wavelength of the first light emitting element, a shorter side of the first light extraction surface and a shorter side of the second light extraction surface facing each other;

a light guide member continuously covering the first light extraction surface, the first lateral surface, the second light extraction surface and the second lateral surface;

a light-transmissive member covering the first light extraction surface and the second light extraction surface via the light guide member; and a first reflective member covering the first lateral surface and the second lateral surface via the light guide member.

The light-transmissive member includes a first light-transmissive layer facing the first light extraction surface and the second light extraction surface, a wavelength conversion layer located on the first light-transmissive layer, and a second light-transmissive layer located on the wavelength conversion layer.

The first light-transmissive layer contains a first matrix and first diffusive particles.

The wavelength conversion layer contains a second matrix and wavelength conversion particles.

The second light-transmissive layer contains a third matrix and second diffusive particles.

According to the above aspect, it is possible to provide a light emitting device in which the color non-uniformity is less likely to occur.

DETAILED DESCRIPTION

Figure 1A:
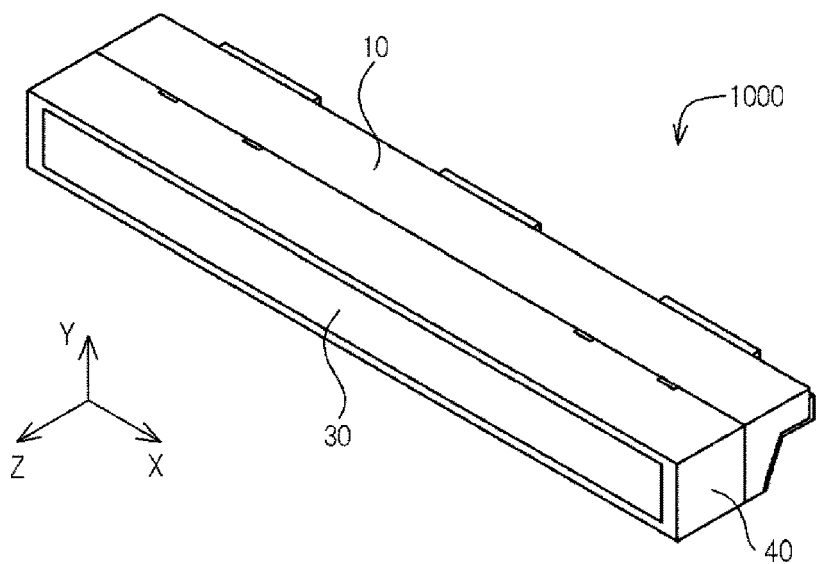
FIG. 1A is a schematic perspective view of a light emitting device according to an embodiment of the present disclosure.

Hereinafter, embodiments of the present disclosure will be described with reference to the attached drawings when necessary. Light emitting devices described below embody the technological idea of the present invention, and the present invention is not limited to any of the following embodiments unless otherwise specified. A content described in one embodiment is applicable to other embodiments and modifications. In the drawings, the size, positional arrangement or the like may be emphasized for clear illustration.

A light emitting device 1000 in an embodiment according to the present disclosure will be described with reference to FIG. 1A through FIG. 10. The light emitting device 1000 includes a first light emitting element 20A, a second light emitting element 20B, a light guide member 50, a light-transmissive member 30, and a first reflective member 40. The first light emitting element 20A includes a rectangular first light extraction surface 201A, a first electrodes formation surface 203A located opposite to the first light extraction surface 201A, a first lateral surfaces 202A located between the first light extraction surface 201A and the first electrodes formation surface 203A, and a pair of first electrodes 21A and 22A formed on the first electrodes formation surface 203A. The second light emitting element 20B includes a rectangular second light extraction surface 201B, a second electrodes formation surface 203B located opposite to the second light extraction surface 201B, a second lateral surfaces 202B located between the second light extraction surface 201B and the second electrodes formation surface 203B, and a pair of second electrodes 21B and 22B formed on the second electrodes formation surface 203B. The second light emitting element 20B has an emission peak wavelength different from an emission peak wavelength of the first light emitting element 20A. In this specification, the term "rectangle" refers to a quadrangle including two longer sides, two shorter sides, and four right-angled corners. In this specification, the "right angle" includes tolerance of about +3° from 90°.

A shorter side 2011A of the first light extraction surface 201A and a shorter side 2011B of the second light extraction surface 201B face each other. The light guide member 50 continuously covers the first light extraction surface 201A, the first lateral surfaces 202A, the second light extraction surface 201B and the second lateral surfaces 202B. The light-transmissive member 30 covers the first light extraction surface 201A and the second light extraction surface 201B via the light guide member 50. The light-transmissive member 30 includes a first light-transmissive layer 31A facing the first light extraction surface 201A and the second light extraction surface 201B, a wavelength conversion layer 31B located on the first light-transmissive layer 31A, and a second light-transmissive layer 31C located on the wavelength conversion layer 31B. The first light-transmissive layer 31A includes a first matrix 312A and first diffusive particles 311A. The wavelength conversion layer 31B includes a second matrix 312B and wavelength conversion particles 311B. The second light-transmissive layer 31C includes a third matrix 312C and second diffusive particles 311C.

Figure 2A:
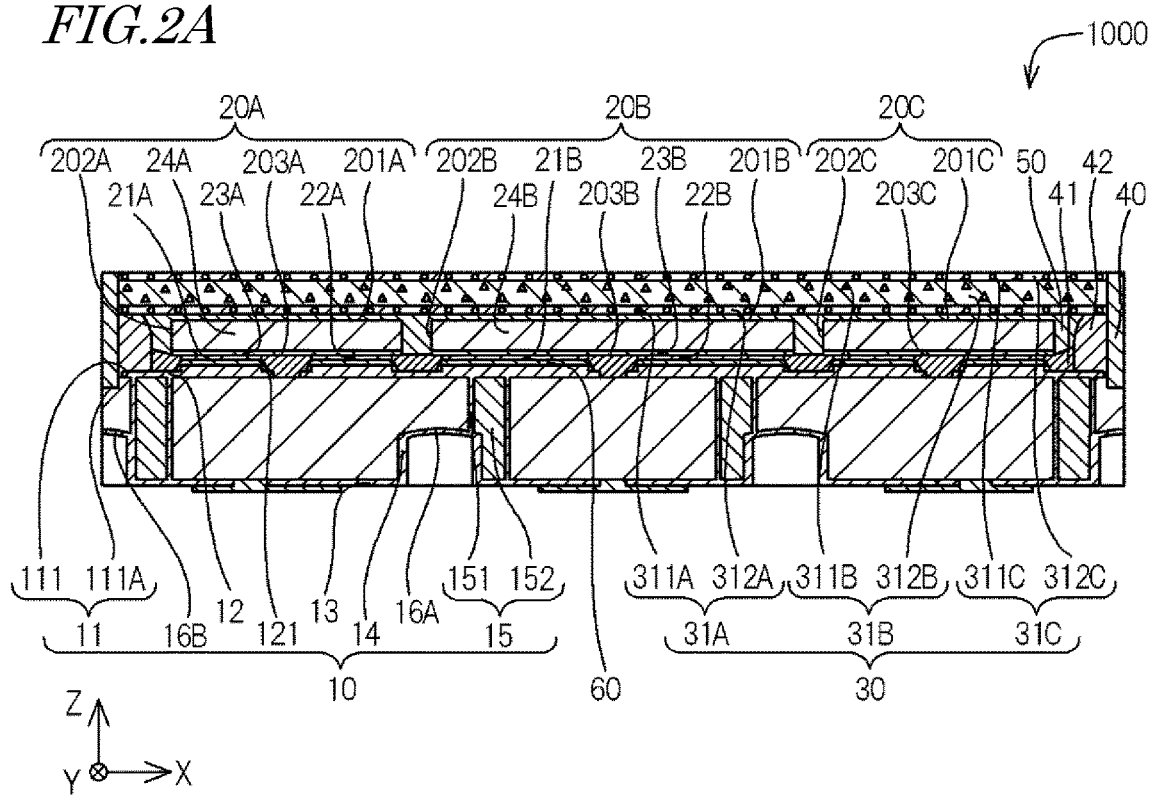
FIG. 2A is a schematic cross-sectional view of the light emitting device taken along line 2A-2A in FIG. 1C.
Figure 2B:
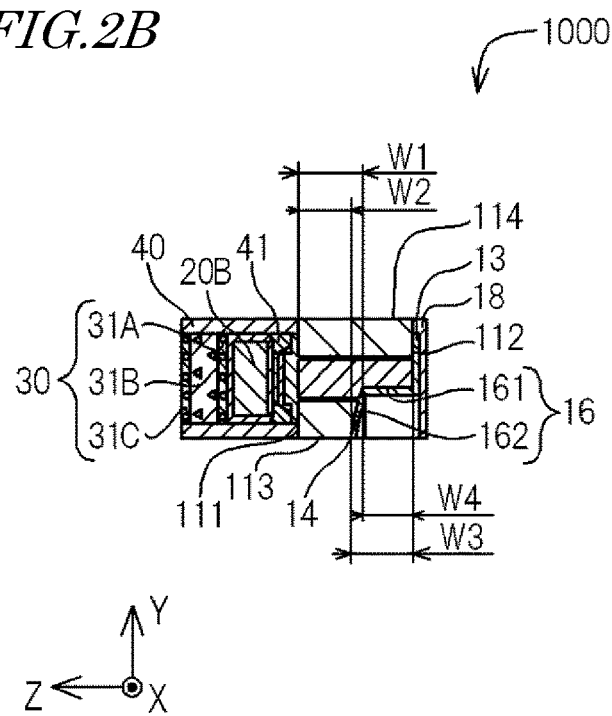
FIG. 2B is a schematic cross-sectional view of the light emitting device taken along line 2B-2B in FIG. 1C.
Figure 2C:
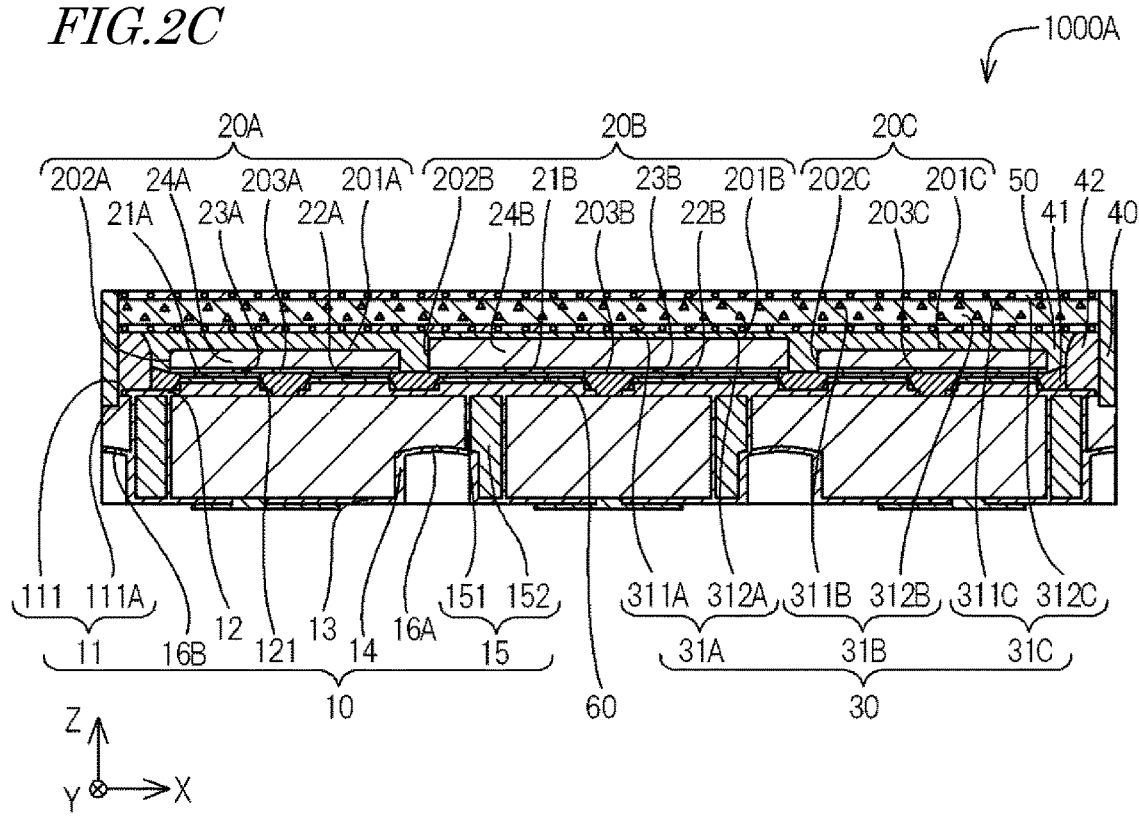
FIG. 2C is a schematic cross-sectional view of a light emitting device in a modification of the embodiment.
Figure 2D:
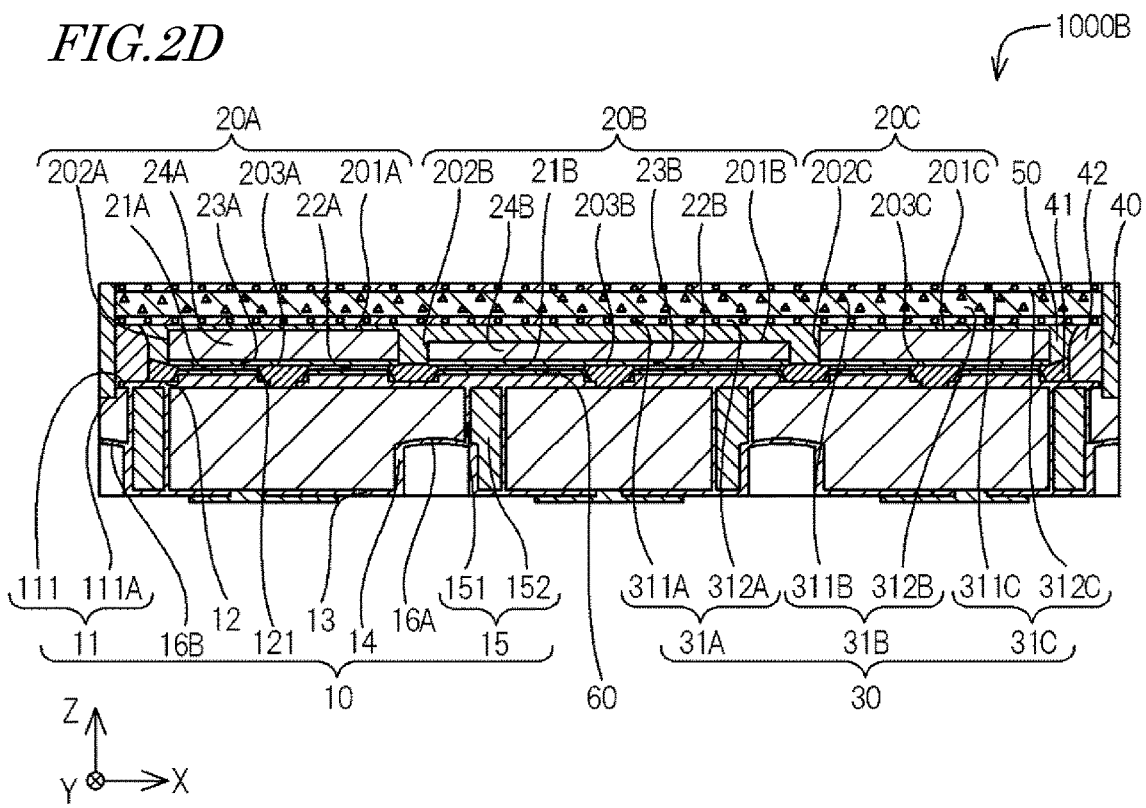
FIG. 2D is a schematic cross-sectional view of a light emitting device in another modification of the embodiment.

As shown in FIG. 2A and FIG. 2B, the light-transmissive member 30 includes the first light-transmissive layer 31A facing the first light extraction surface 201A and the second light extraction surface 201B. With such a structure, light from the first light emitting element 20A and light from the second light emitting element 20B are diffused by the first light-transmissive layer 31A. This allows the light from the first light emitting element 20A and the light from the second light emitting element 20B to be mixed together in the first light-transmissive layer 31A. This can reduce a color non-uniformity of the light emitting device 1000.

It is preferable that the first light-transmissive layer 31A substantially includes no wavelength conversion particles. The wavelength conversion particles absorb a part of the light from the first light emitting element 20A and/or the second light emitting element 20B when being excited by the light from the first light emitting element 20A and/or the second light emitting element 20B. Because the first light-transmissive layer 31A is located between the first light extraction surface 201A/the second light extraction surface 201B and the wavelength conversion layer 31B, the light from the first light emitting element 20A, and/or the light from the second light emitting element 20B are mixed together before being absorbed by the wavelength conversion particles. This can suppress a decline in the light extraction efficiency of the light emitting device. The expression that "substantially includes no wavelength conversion particles" indicates that unavoidable contamination with the wavelength conversion particles is not eliminated. It is preferable that the first light-transmissive layer 31A has a content of the wavelength conversion particles of 0.05% by weight or lower.

As shown in FIG. 2A, the light guide member 50 continuously covers the first light extraction surface 201A, the first lateral surfaces 202A, the second light extraction surface 201B and the second lateral surfaces 202B. With such a structure, the light from the first light emitting element 20A and the light from the second light emitting element 20B are mixed together in the light guide member 50. This can reduce the color non-uniformity of the light emitting device.

It is preferable that the light guide member 50 substantially includes no wavelength conversion particles. The structure in which the light guide member 50 substantially includes no wavelength conversion particles suppresses a situation where a part of the light from the first light emitting element 20A and/or the second light emitting element 20B is absorbed into the wavelength conversion particles in the light guide member. This can alleviate a decline in the light extraction efficiency of the light emitting device.

As shown in FIG. 2A and FIG. 2B, the second light-transmissive layer 31C is located on the wavelength conversion layer 31B. With such a structure, the light from the first light emitting element 20A and the light from the second light emitting element 20B are mixed, in the second light-transmissive layer 31C, with light from the wavelength conversion particles 311B excited by the first light emitting element 20A and/or the second light emitting element 20B. This can reduce the color non-uniformity of the light emitting device. In addition, the second light-transmissive layer 31C is located on the wavelength conversion layer 31B. With such a structure, even if the wavelength conversion layer 31B includes wavelength conversion particles, which are weak against moisture, the second light-transmissive layer 31C serves as a protective layer.

This can alleviate deterioration of the wavelength conversion particles. Examples of the wavelength conversion particles weak against moisture include, for example, a manganese-activated fluoride phosphor. The manganese-activated fluoride phosphor emits light having a relatively narrow spectral line width, which is preferable from the point of view of color reproducibility.

It is preferable that the second light-transmissive layer 31C substantially includes no wavelength conversion particles. The structure in which the second light-transmissive layer 31C substantially includes no wavelength conversion particles can reduce a possibility where a part of the light from the first light emitting element 20A, and/or the second light emitting element 20B is absorbed into the wavelength conversion particles in the second light-transmissive layer 31C. This can alleviate a decline in the light extraction efficiency of the light emitting device.

It is preferable that the first matrix 312A, the second matrix 312B and the third matrix 312C contain the same resin material as each other. The structure in which the first matrix 312A and the second matrix 312B contain the same resin material as each other can increase a joining strength between the first matrix 312A and the second matrix 312B. The structure in which the second matrix 312B and the third matrix 312C contain the same resin material as each other can increase a joining strength between the second matrix 312B and the third matrix 312C.

The first light emitting element 20A includes at least a first semiconductor stack body 23A, and the pair of first electrodes 21A, and 22A are formed on the first semiconductor stack body 23A. In this embodiment, the first light emitting element 20A includes a first element substrate 24A, but the first element substrate 24A may be removed. Similarly, the second light emitting element 20B includes at least a second semiconductor stack body 23B, and the pair of second electrodes 21B and 22B are formed on the second semiconductor stack body 23B. In this embodiment, the second light emitting element 20B includes a second element substrate 24B, but the second element substrate 24B may be removed. Typically, the first element substrate 24A and the second element substrate 24B are each an element substrate formed of sapphire or the like described below.

The emission peak wavelength of the first light emitting element 20A and the emission peak wavelength of the second light emitting element 20B merely need to be different from each other. It is preferable that the emission peak wavelength of the first light emitting element 20A is in the range of 430 nm or longer and shorter than 490 nm (i.e., wavelength range of blue light) and that the emission peak wavelength of the second light emitting element 20B is in the range of 490 nm or longer and 570 nm or shorter (i.e., wavelength range of green light). With such an arrangement, the light emitting device 1000 can have an improved color rendering properties. In the case where the emission peak wavelength of the second light emitting element 20B is in the range of 490 nm or longer and 570 nm or shorter, it is preferable that the second light emitting element 20B has a half width of 5 nm or longer and 40 nm or shorter. Setting the half width of the second light emitting element 20B is 5 nm or longer can improve the optical output of the second light emitting element 20B. Setting the half width of the second light emitting element 20B is 40 nm or shorter can exhibit a sharp peak having a strong green light component. This can realize a high color reproducibility in the case where the light emitting device 1000 is used for a liquid crystal display device. Use of a light emitting element that emits green light can shorten the half width of the green light more easily than the green light provided by use of a green phosphor.

In the case where the emission peak wavelength of the first light emitting element 20A is in the range of 430 nm or longer and shorter than 490 nm (i.e., wavelength range of blue light) and the emission peak wavelength of the second light emitting element 20B is in the range of 490 nm or longer and 570 nm or shorter (i.e., wavelength range of green light), it is preferable that the emission peak wavelength of the wavelength conversion particles 311B is in the range of 580 nm or longer and shorter than 680 nm (i.e., wavelength range of red light). Such an arrangement increases the color rendering properties of the light emitting device 1000.

Figure 3A:
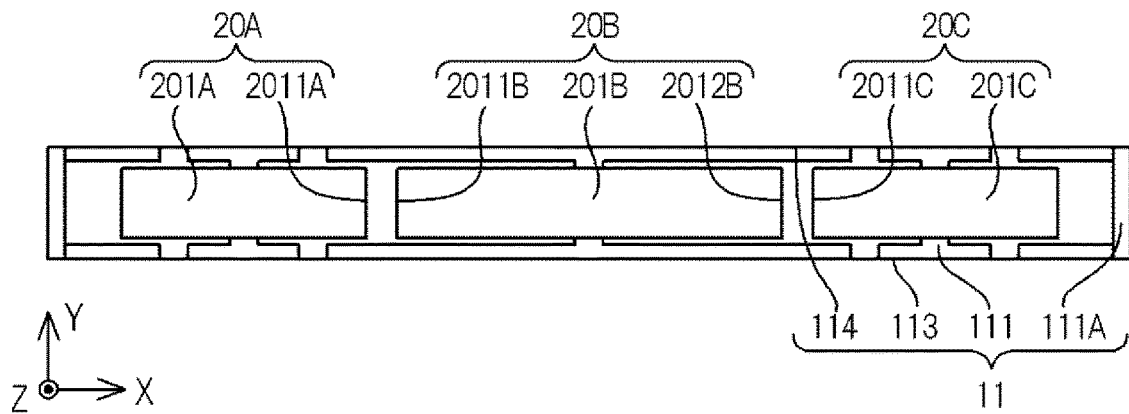
FIG. 3A is a schematic front view of a substrate, a first light emitting element, a second light emitting element and a third light emitting element of the light emitting device in the embodiment.

As shown in FIG. 3A, the shorter side 2011A of the first light extraction surface 201A and the shorter side 2011B of the second light extraction surface 201B face each other. Such a structure allows the light emitting device 1000 to be thinner in a Y direction.

The first reflective member 40 covers the first lateral surface 202A and the second lateral surface 202B via the light guide member 50. With such a structure, light traveling in an X direction and/or the Y direction from the first light emitting element 20A and the second light emitting element 20B is reflected by the first reflective member 40 to increase the amount of light traveling in a Z direction. This allows the light from the first light emitting element 20A and the light from the second light emitting element 20B to pass the light-transmissive member 30 more easily, and thus the color non-uniformity of the light emitting device can be reduced.

As shown in FIG. 2A, it is preferable that a lateral surface of the light-transmissive member 30 is covered with the first reflective member 40. With such a structure, the light emitting device 1000 has a high contrast between a light emitting region and a non-light emitting region, namely, has a highly clear border between the light emitting region and the non-light emitting region.

As shown in FIG. 2A, the light emitting device 1000 includes three light emitting elements, in other words, the first light emitting element 20A, the second light emitting element 20B and a third light emitting element 20C. However, as in a light emitting device 2000 shown in FIG. 4A through FIG. 4D, a light emitting device in an embodiment according to the present disclosure may include two light emitting elements, in other words, the first light emitting element 20A and the second light emitting element 20B.

Figure 4A:
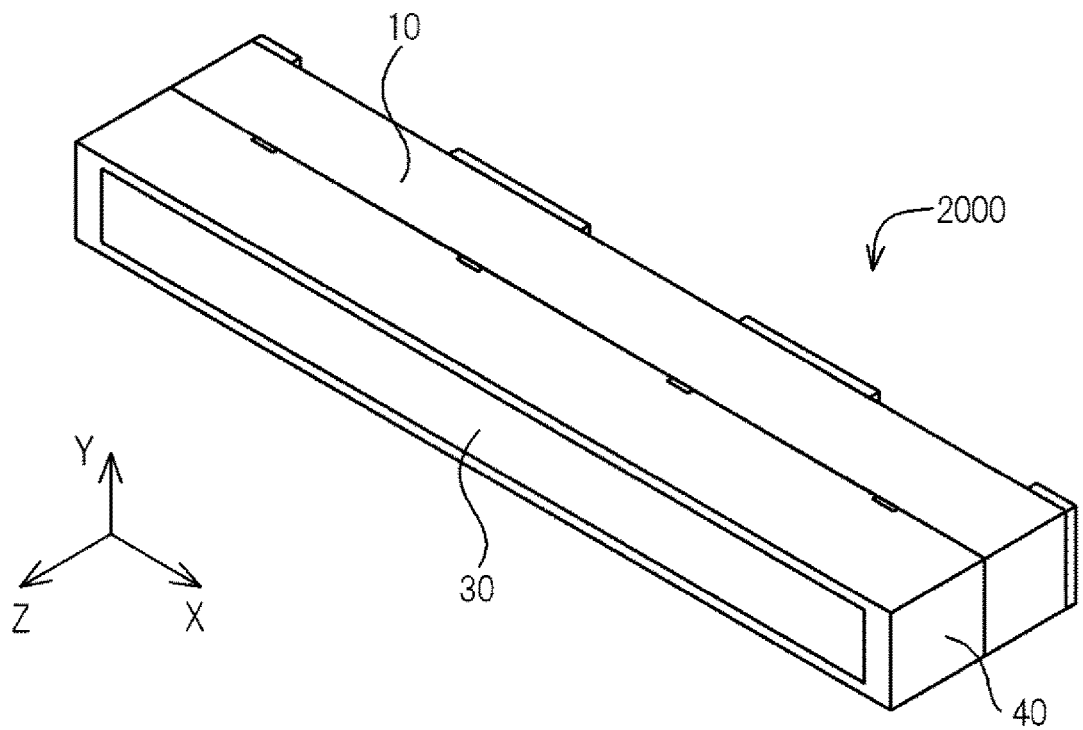
FIG. 4A is a schematic perspective view of a light emitting device in still another modification of the embodiment.
Figure 4B:
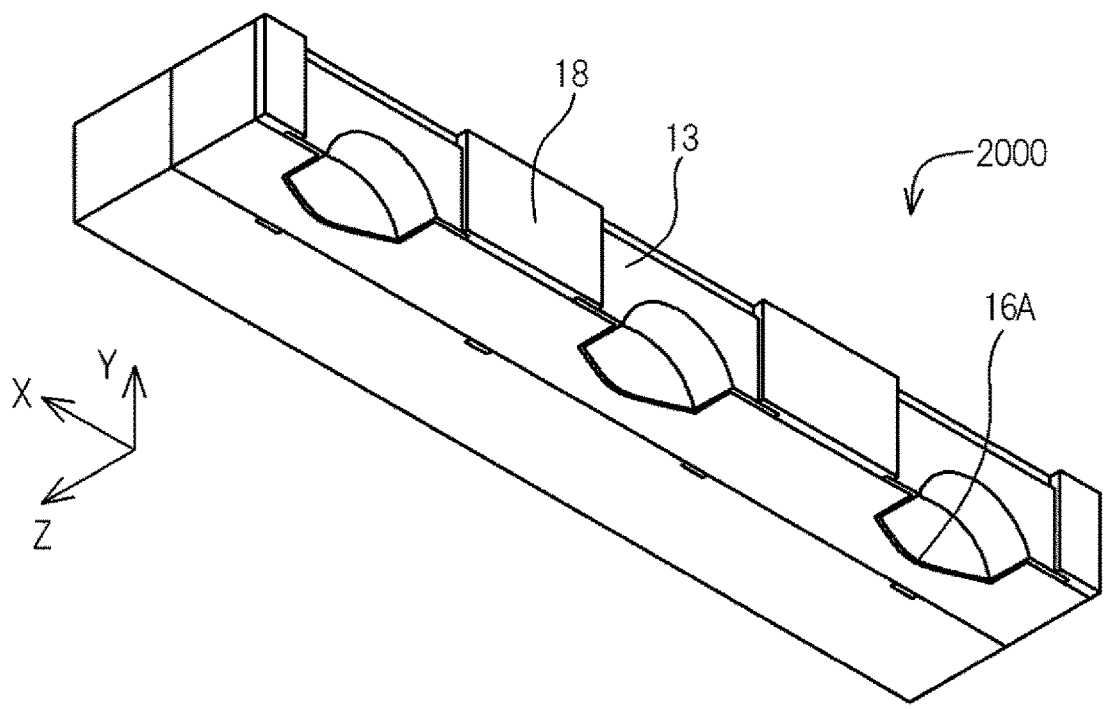
FIG. 4B is a schematic perspective view of the light emitting device in the modification of the embodiment.
Figure 4C:
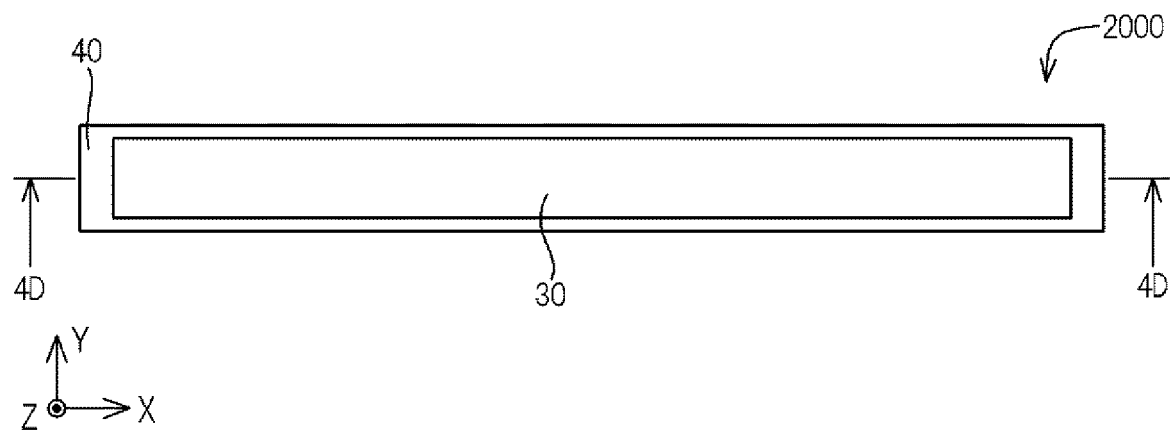
FIG. 4C is a schematic front view of the light emitting device in the modification of the embodiment.
Figure 4D:
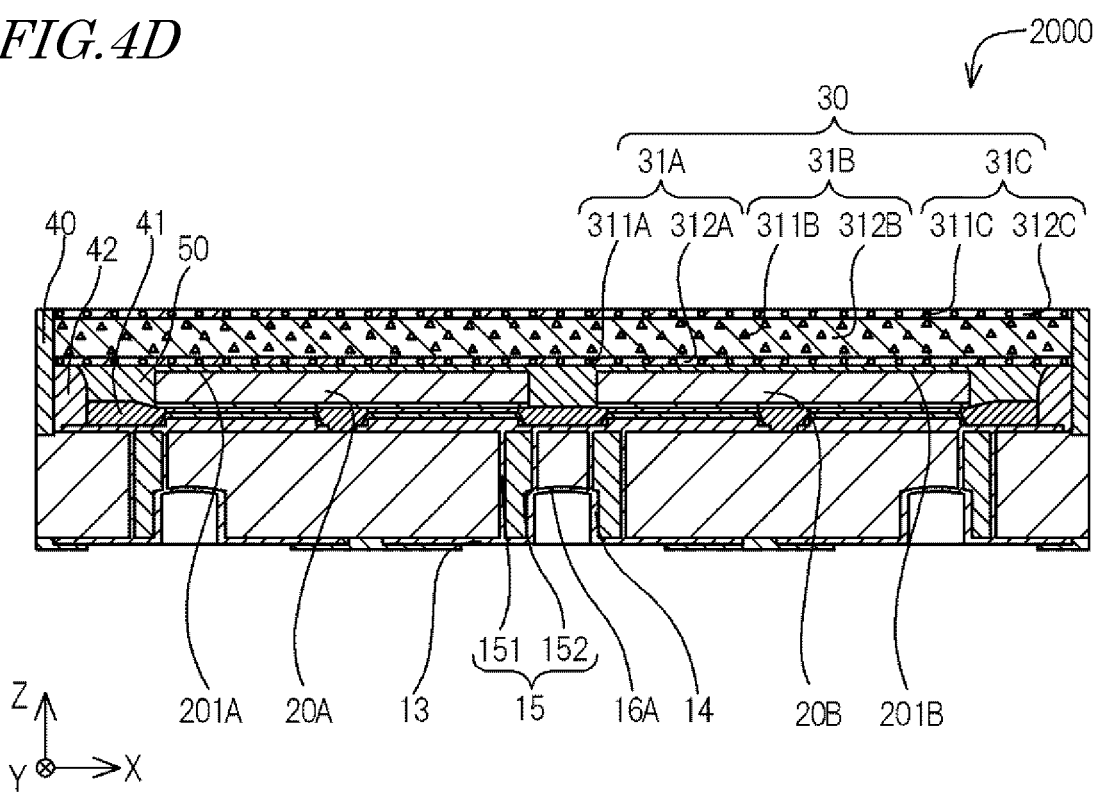
FIG. 4D is a schematic cross-sectional view of the light emitting device taken along line 4D-4D in FIG. 4C.
Figure 4E:
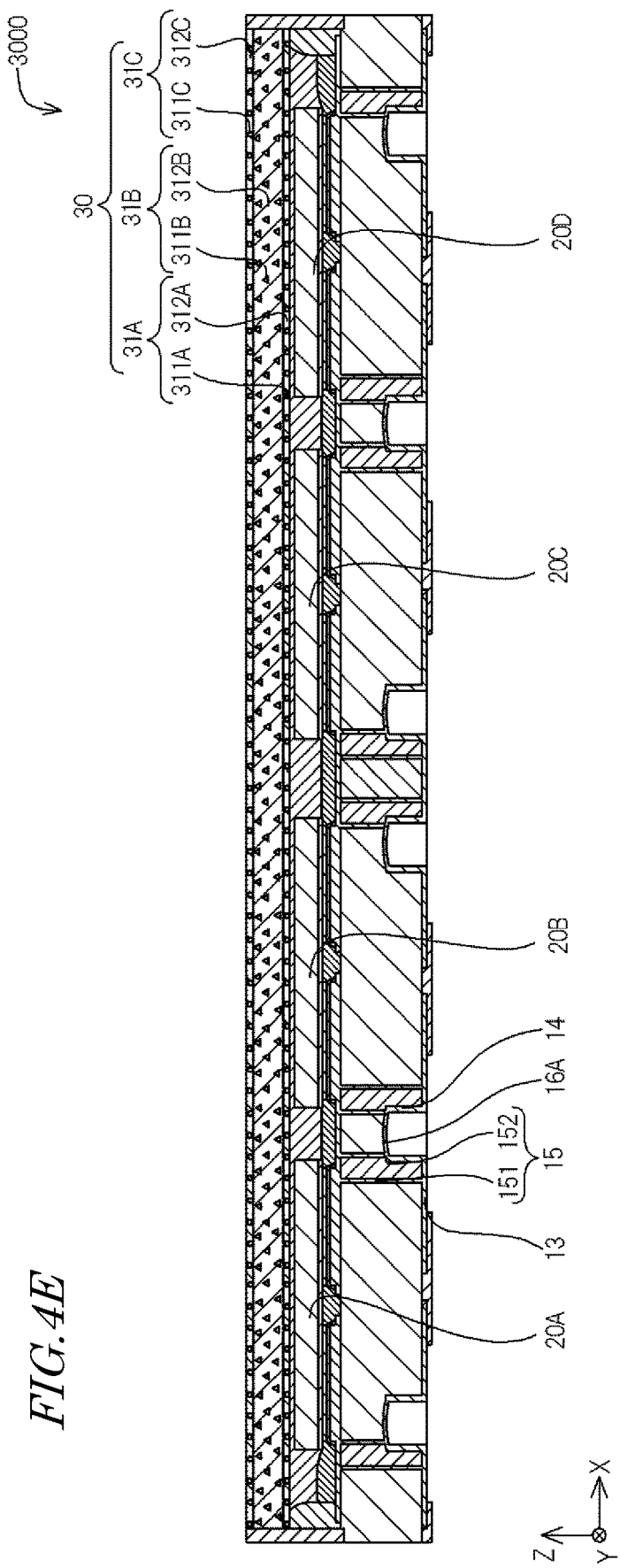
FIG. 4E is a schematic cross-sectional view of a light emitting device in yet another modification of the embodiment.

As in a light emitting device 3000 shown in FIG. 4E, a light emitting device in an embodiment according to the present disclosure may include four light emitting elements, in other words, the first light emitting element 20A, the second light emitting element 20B, the third light emitting element 20C and a fourth light emitting element 20D. A light emitting device in an embodiment according to the present disclosure may include five or more light emitting elements.

The third light emitting element 20C includes a third light extraction surface 201C, a third electrodes formation surface 203C located opposite to the third light extraction surface 201C, a third lateral surfaces 202C located between the third light extraction surface 201C and the third electrodes formation surface 203C, and a pair of third electrodes 21C and 22C formed on the third electrodes formation surface 203C. In the exemplary construction illustrated in FIG. 2A, the light guide member 50 continuously covers the third light extraction surface 201C and the third lateral surfaces 202C. The light-transmissive member 30 covers the third light extraction surface 201C via the light guide member 50. The first reflective member 40 covers the third lateral surfaces 202C via the light guide member 50.

Figure 1B:
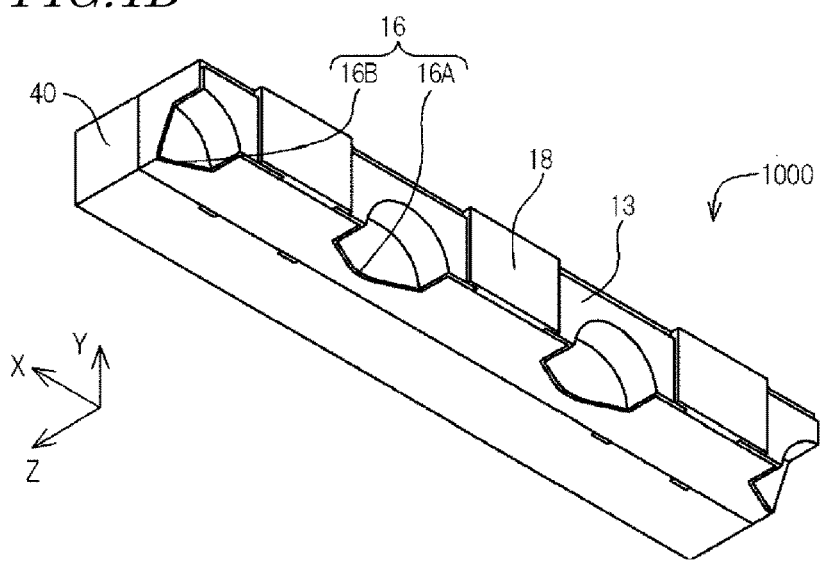
FIG. 1B is a schematic perspective view of the light emitting device in the embodiment.
Figure 1C:
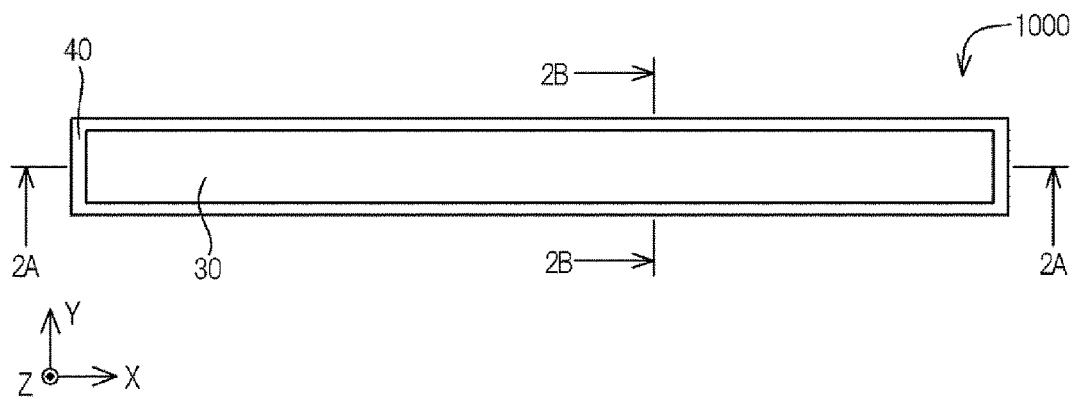
FIG. 1C is a schematic front view of the light emitting device in the embodiment.

As shown in FIGS. 1B and 2B, the light emitting device 1000 may include an insulating film 18 covering a part of a second wiring portion 13. The insulating film 18 can ensure insulation property and prevent shortcircuiting of the light emitting device 1000. The insulating film 18 also can prevent or alleviate the second wiring portion 13 from being peeled off from a base member 11.

As shown in FIG. 2A, the first light extraction surface 201A of the first light emitting element 20A and the second light extraction surface 201B of the second light emitting element 20B may have substantially the same height as each other in the Z direction. Alternatively, the first light extraction surface 201A of the first light emitting element 20A and the second light extraction surface 201B of the second light emitting element 20B may have different heights from each other in the Z direction. For example, as in a light emitting device 1000A shown in FIG. 2C, the first light extraction surface 201A may be positioned lower than that of the second light extraction surface 201B in the Z direction. With the structure in which the first light extraction surface 201A is positioned lower than that of the second light extraction surface 201B in the Z direction, a portion of the light guide member 50 that is located on the first light extraction surface 201A can be made thicker in the Z direction. Therefore, the light from the first light emitting element 20A and the light from the second light emitting element 20B can be mixed together more easily in the light guide member 50. This can reduce the color non-uniformity of the light emitting device. As in a light emitting device 1000B shown in FIG. 2D, the first light extraction surface 201A may be positioned higher than that of the second light extraction surface 201B in the Z direction. With the structure in which the first light extraction surface 201A is positioned higher than that of the second light extraction surface 201B in the Z direction, a portion of the light guide member 50 that is located on the second light extraction surface 201A can be made thicker in the Z direction. Therefore, the light from the first light emitting element 20A and the light from the second light emitting element 20B are mixed together more easily in the light guide member 50. This can reduce the color non-uniformity of the light emitting device.

As shown in FIG. 3A, it is preferable that the second light emitting element 20B is located between the first light emitting element 20A and the third light emitting element 20C as seen in a front view. With such a structure, the first light emitting element 20A, the second light emitting element 20B and the third light emitting element 20C are arrayed in one direction. This allows the light emitting device to be thinner in the Y direction. In the case where the third light extraction surface 201C is rectangular, it is preferable that a shorter side 2012B of the second light extraction surface 201B and a shorter side 2011C of the third light extraction surface 201C face each other. Such a structure allows the light emitting device to be thinner in the Y direction.

Figure 3B:
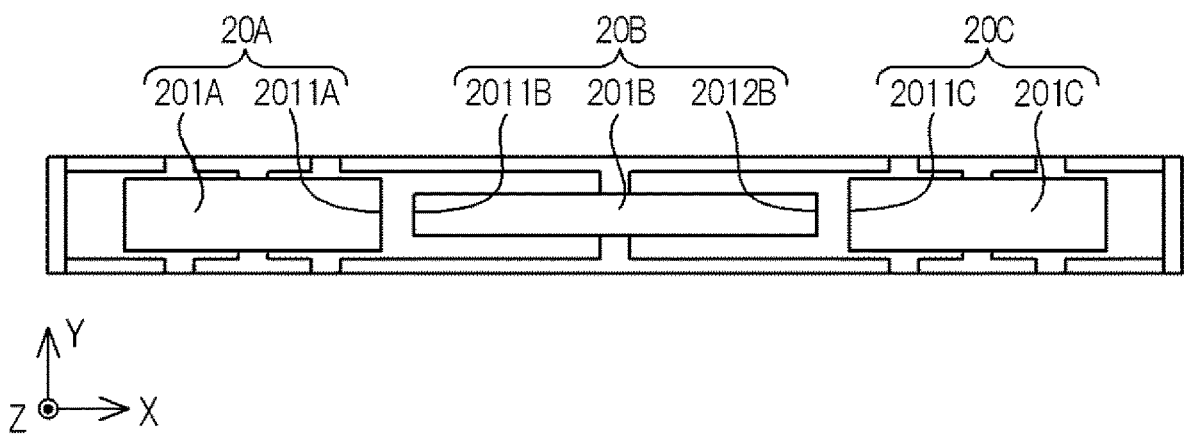
FIG. 3B is a schematic front view of a substrate, a first light emitting element, a second light emitting element and a third light emitting element of a light emitting device in a modification of the embodiment.
Figure 3C:
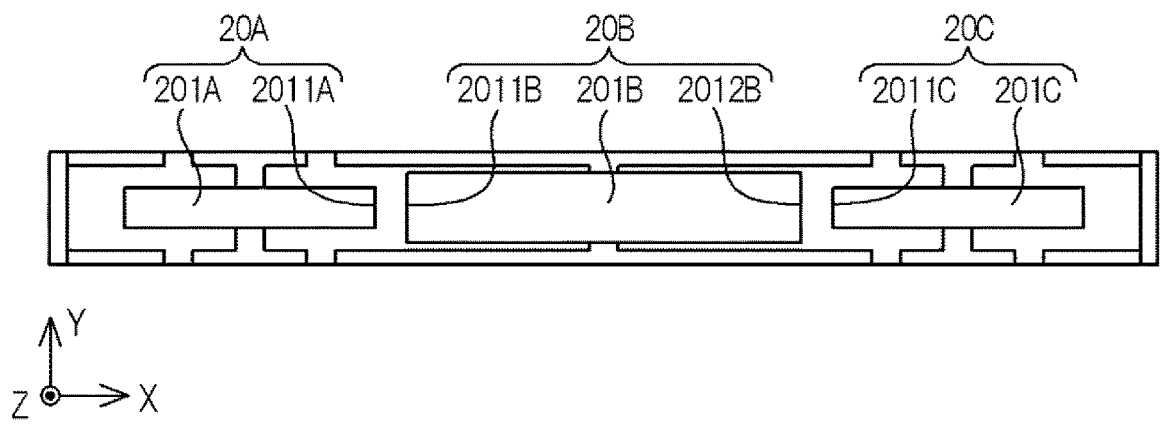
FIG. 3C is a schematic front view of a substrate, a first light emitting element, a second light emitting element and a third light emitting element of a light emitting device in another modification of the embodiment.

As shown in FIG. 3A, the shorter side 2011A of the first light extraction surface 201A of the first light emitting element 20A and the shorter side 2011B of the second light extraction surface 201B of the second light emitting element 20B may have the same length as each other. Alternatively, the shorter side 2011A of the first light extraction surface 201A of the first light emitting element 20A and the shorter side 2011B of the second light extraction surface 201B of the second light emitting element 20B may have different lengths from each other. For example, as shown in FIG. 3B, the shorter side 2011A of the first light extraction surface 201A may be longer than the shorter side 2011B of the second light extraction surface 201B. With such a structure, a portion of the light guide member 50 positioned along a longer lateral surfaces of the second light emitting element 20B can be made thicker in the Y direction. Therefore, the light from the first light emitting element 20A and the light from the second light emitting element 20B are mixed together more easily in the light guide member 50. This can reduce the color non-uniformity of the light emitting device 1000. As shown in FIG. 3C, the shorter side 2011A of the first light extraction surface 201A may be shorter than the shorter side 2011B of the second light extraction surface 201B. With such a structure, a portion of the light guide member 50 positioned along a longer lateral surfaces of the first light emitting element 20A can be made thicker in the Y direction. Therefore, the light from the first light emitting element 20A and the light from the second light emitting element 20B are mixed together more easily in the light guide member 50. This can reduce the color non-uniformity of the light emitting device.

The third light emitting element 20C may have an emission peak wavelength same as, or different from, the emission peak wavelength of the first light emitting element 20A or the emission peak wavelength of the second light emitting element 20B. In the case where the second light emitting element 20B is located between the first light emitting element 20A and the third light emitting element 20C, it is preferable that the emission peak wavelength of the third light emitting element 20C is the same as the emission peak wavelength of the first light emitting element 20A. Such an arrangement can reduce the color non-uniformity of the light emitting device. In this specification, the expression that the "emission peak wavelength is the same" indicates that a tolerance of about +10 nm is allowed. In the case where, for example, the emission peak wavelength of the first light emitting element 20A is in the range of 430 nm or longer and shorter than 490 nm (i.e., wavelength range of blue light), it is preferred that the emission peak wavelength of the third light emitting element 20C is in the range of 430 nm or longer and shorter than 490 nm. With such an arrangement, wavelength conversion particles having an excitation efficiency peak in the range of 430 nm or longer and shorter than 490 nm may be selected, and thus the excitation efficiency of the wavelength conversion particles can be improved.

Figure 5A:
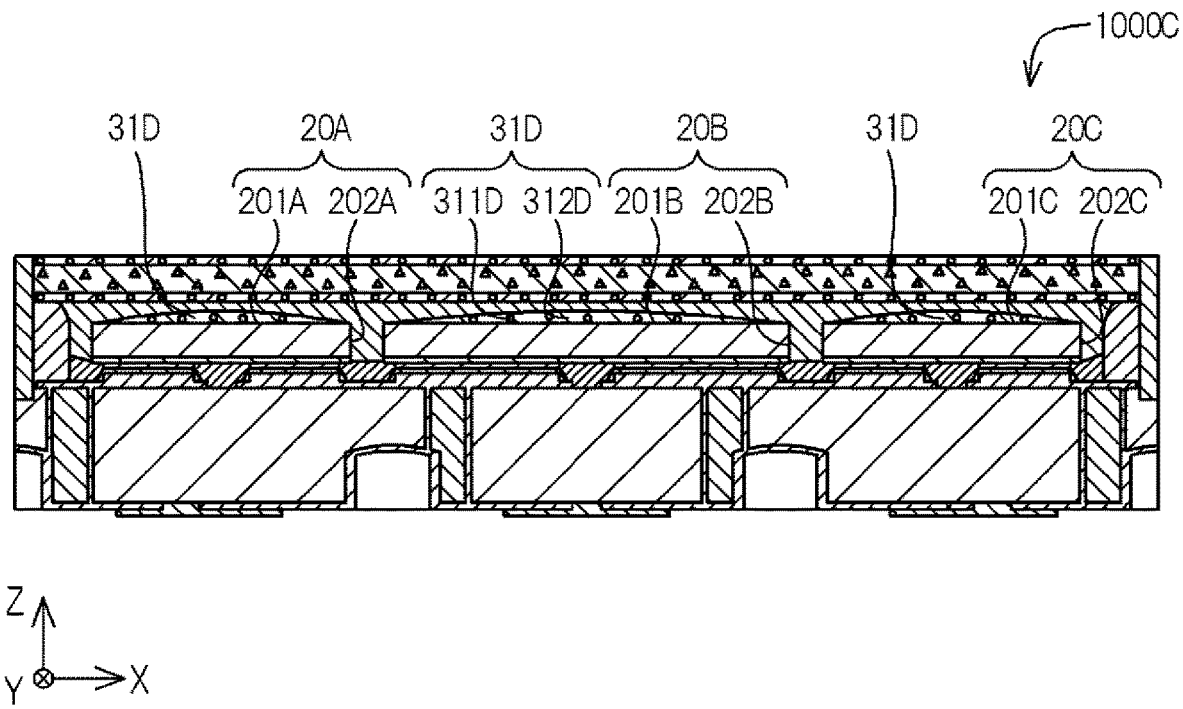
FIG. 5A is a schematic cross-sectional view of a light emitting device in yet another modification of the embodiment.
Figure 5B:
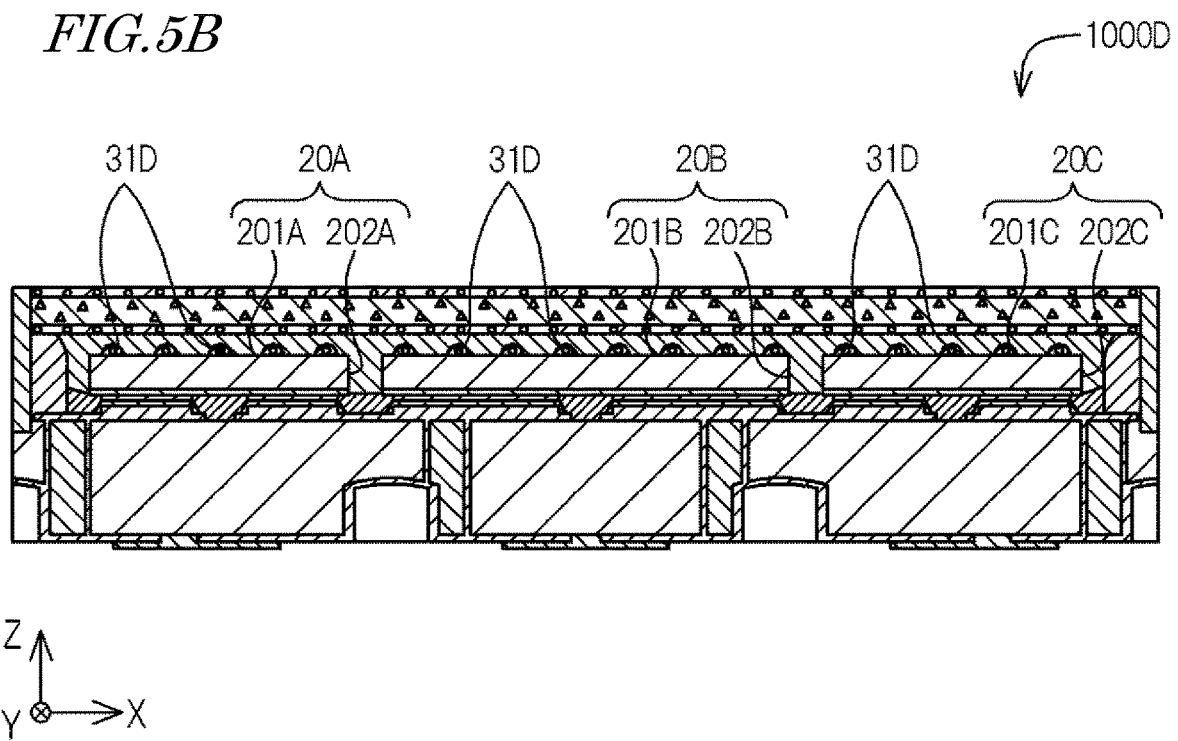
FIG. 5B is a schematic cross-sectional view of a light emitting device in yet another modification of the embodiment.

As in a light emitting device 1000C shown in FIG. 5A, a light emitting device in an embodiment according to the present disclosure may include a cover member 31D covering the second light extraction surface 201B of the second light emitting element 20B. In this example, the cover member 31D is located between the second light extraction surface 201B of the second light emitting element 20B and the light guide member 50. In the case where the cover member 31D contains third diffusive particles 311D, the cover member 31D covering the second light extraction surface 201B can decrease the amount of light traveling in the Z direction from the second light emitting element 20B and thus can increase the amount of light traveling in the X direction and/or the Y direction. This can diffuse the light from the second light emitting element 20B in the light guide member 50, and thus can reduce the color non-uniformity of the light emitting device. It is preferable that the cover member 31D containing the third diffusive particles 311D is disposed such that at least a part of the second lateral surfaces 202B is exposed. Such a structure can alleviate a decrease in the amount of the light traveling in the X direction and/or the Y direction from the second light emitting element 20B.

The cover member 31D may include wavelength conversion particles. The provision of the cover member 31D covering the second light extraction surface 201B of the second light emitting element 20B and containing the wavelength conversion particles allows color adjustment of the light emitting device to be performed easily. The wavelength conversion particles 312D contained in the cover member 31D may be formed of a material comprising same as, or different from, that of the wavelength conversion particles 311B included in the wavelength conversion layer 31B. In the case where, for example, the emission peak wavelength of the second light emitting element 20B is in the range of 490 nm or longer and 570 nm or shorter (i.e., wavelength range of green light), the wavelength conversion particles may be formed of a CASN-based phosphor and/or an SCASN-based phosphor, which is excited by light in the range of 490 nm or longer and 570 nm or shorter. Alternatively, the wavelength conversion particles may be formed of a phosphor of $(Sr, Ca)LiAl_3N_4:Eu$. The cover member 31D may cover the first light extraction surface 201A of the first light emitting element 20A and/or the third light extraction surface 201C of the third light emitting element 20C.

As in the light emitting device 1000C shown in FIG. 5A, one cover member 31D may cover the element light extraction surface of one light emitting element. Alternatively, as in a light emitting device 1000D shown in FIG. 5B, a plurality of the cover members 31D may cover the element light extraction surface of one light emitting element. In this case, a part of the element light extraction surface of the light emitting element is exposed from the cover members 31D, and thus the light extraction efficiency of the light emitting element can be improved.

As shown in FIG. 2A, the light emitting device 1000 may include a second reflective member 41 covering the first electrodes formation surface 203A and the second electrodes formation surface 203B. In the case where the light emitting device 1000 includes a substrate on which the first light emitting element 20A and the second light emitting element 20B are placed, the structure in which the first electrodes formation surface 203A and the second electrodes formation surface 203B are covered with the second reflective member 41 to alleviate the light from the first light emitting element 20A and the light from the second light emitting element 20B from being absorbed into the substrate. This can improve the light extraction efficiency of the light emitting device 1000. In the case where the light emitting device 1000 does not include the substrate on which the first light emitting element 20A and the second light emitting element 20B are placed, the structure in which the first electrodes formation surface 203A and the second electrodes formation surface 203B are covered with the second reflective member 41 can alleviate the light from the first light emitting element 20A and the light from the second light emitting element 20B from being absorbed into a mounting substrate on which the light emitting device 1000 is mounted. This can improve the light extraction efficiency of the light emitting device 1000. It is preferable that the second reflective member 41 includes an inclining portion having a greater thickness in the Z direction as being farther from the first light emitting element 20A and/or the second light emitting element 20B. With the structure in which the second reflective member 41 includes the inclining portion, the extraction efficiency of the light from the first light emitting element 20A and/or the second light emitting element 20B can be improved.

Figure 5C:
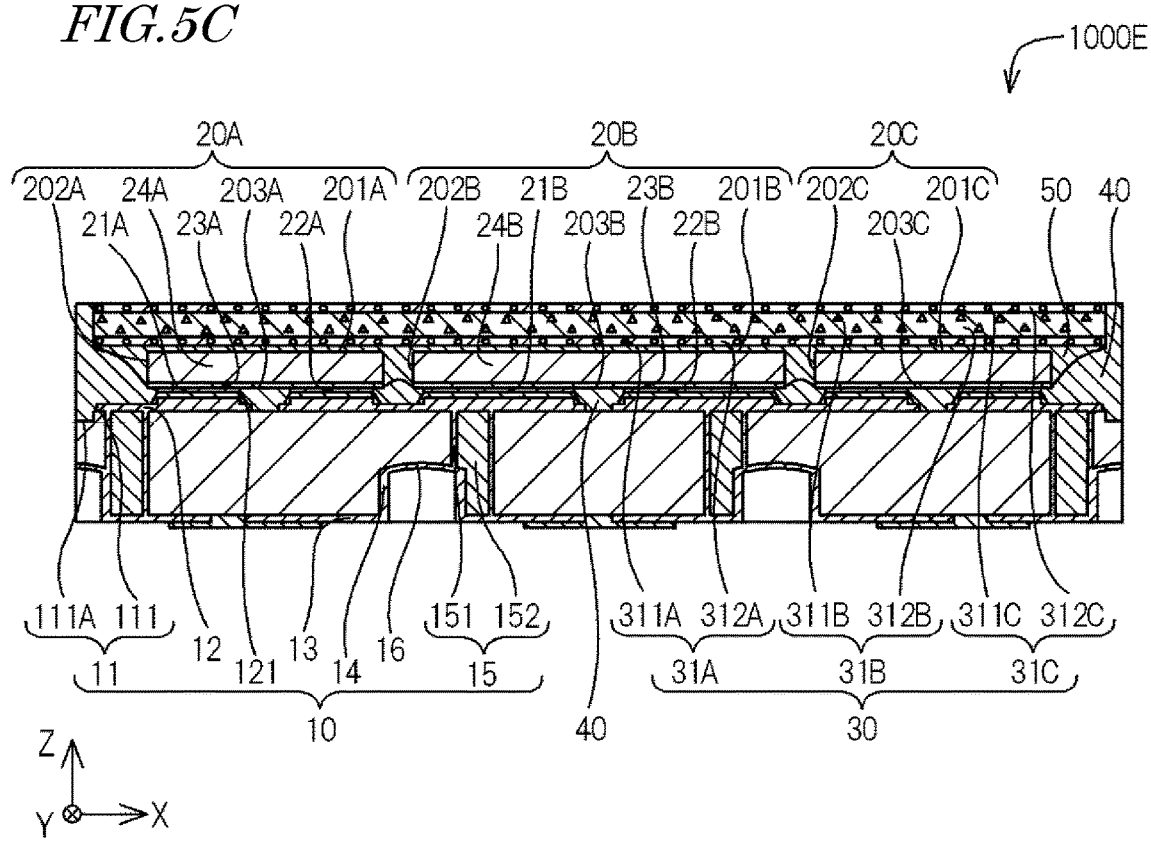
FIG. 5C is a schematic cross-sectional view of a light emitting device in yet another modification of the embodiment.

As in a light emitting device 1000E shown in FIG. 5C, the first electrodes formation surface 203A and the second electrodes formation surface 203B may be covered with the first reflective member 40. Such a structure improves the light extraction efficiency of the light emitting device 1000E.

As shown in FIG. 2A, the light emitting device 1000 may include a third reflective member 42 provided between the light guide member 50 and the first reflective member 40. The third reflective member 42 covers the first lateral surface 202A and the second lateral surface 202B via the light guide member 50. After the third reflective member 42 is formed, the light guide member 50 may be formed by potting or the like, so that shape of the light guide member 50 is less likely to be varied. It is preferable that a surface of the third reflective member 42 that faces the light-transmissive member 30 is flat. With such a structure, the light-transmissive member 30 is easily formed after the third reflective member 42 is formed. In the case where the light emitting device 1000 includes the third reflective member 42, the first reflective member 40 covers the first lateral surface 202A and the second lateral surface 202B via the third reflective member 42 and the light guide member 50.

As shown in FIG. 2A, the light emitting device 1000 may include the substrate 10 on which the first light emitting element 20A and the second light emitting element 20B are placed. In the case where the substrate 10 is included, the strength of the light emitting device 1000 can be increased. However, as in a light emitting device 1000F shown in FIG. 5D, a light emitting device in an embodiment according to the present disclosure does not need to include a substrate for which the first light emitting element 20A and the second light emitting element 20B are placed. In the case where the substrate 10 is not included, the light emitting device 1000F can be thinner in the Z direction.

Figure 5D:
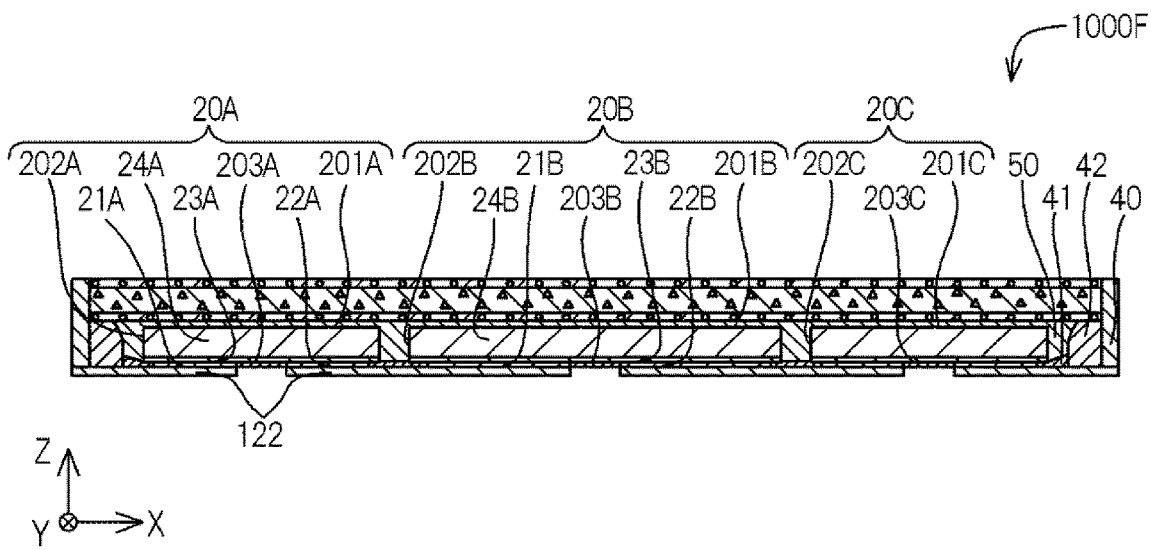
FIG. 5D is a schematic cross-sectional view of a light emitting device in yet another modification of the embodiment.
Figure 6A:
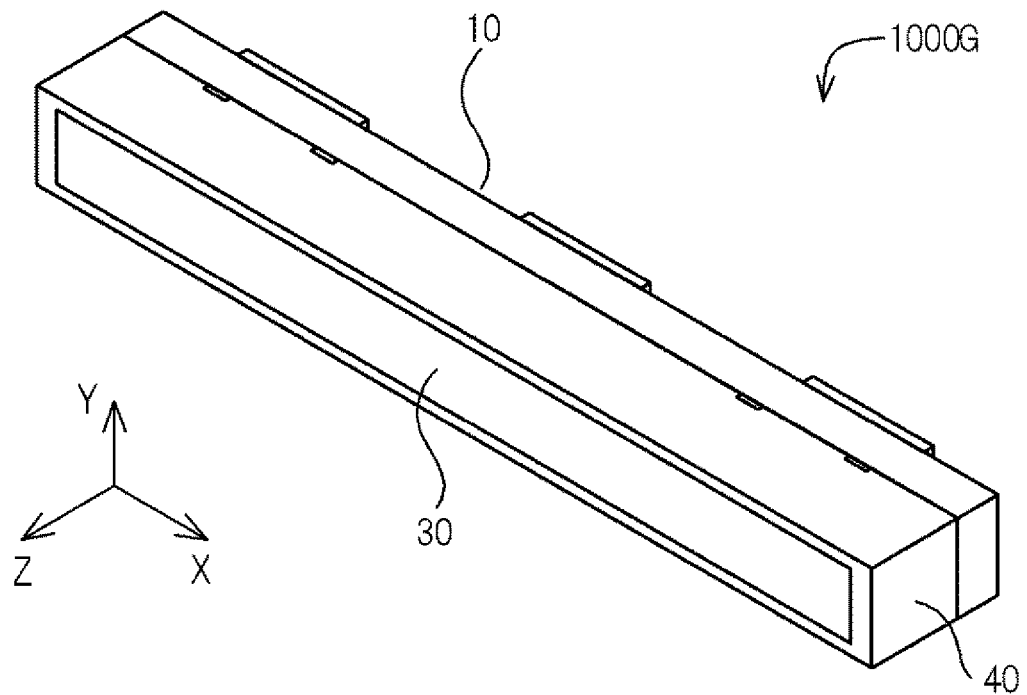
FIG. 6A is a schematic perspective view of a light emitting device in yet another modification of the embodiment.
Figure 6B:
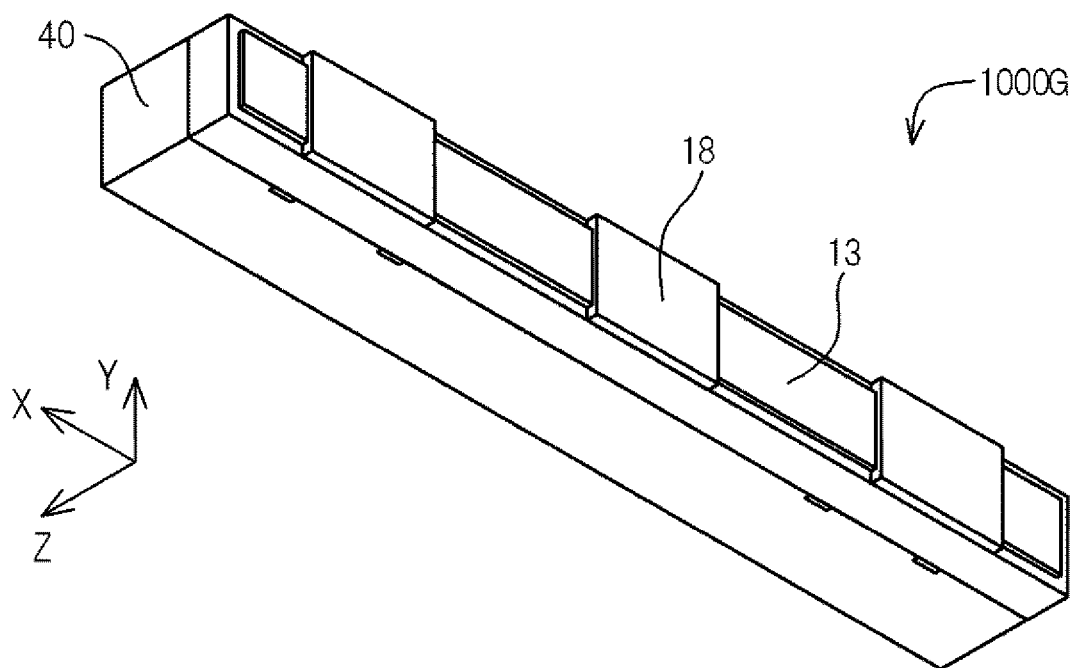
FIG. 6B is a schematic perspective view of the light emitting device in the modification of the embodiment.
Figure 6C:
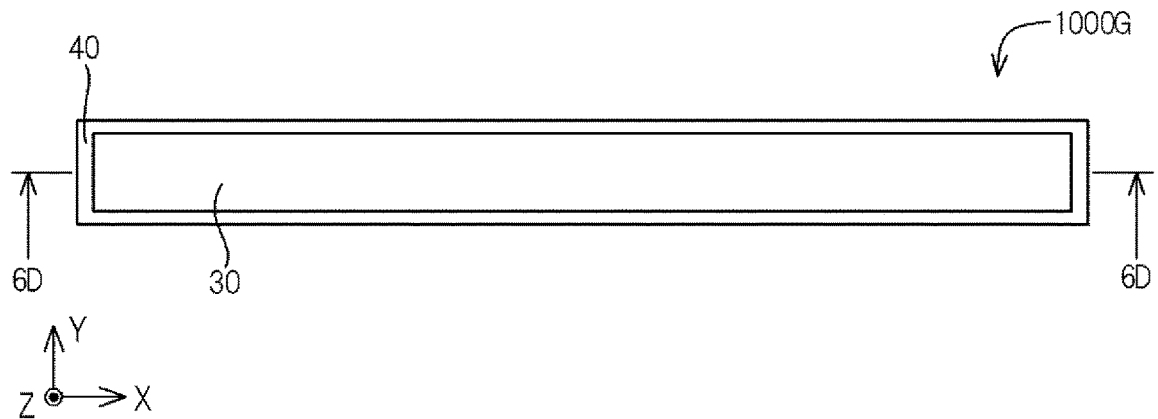
FIG. 6C is a schematic front view of the light emitting device in the modification of the embodiment.
Figure 6D:
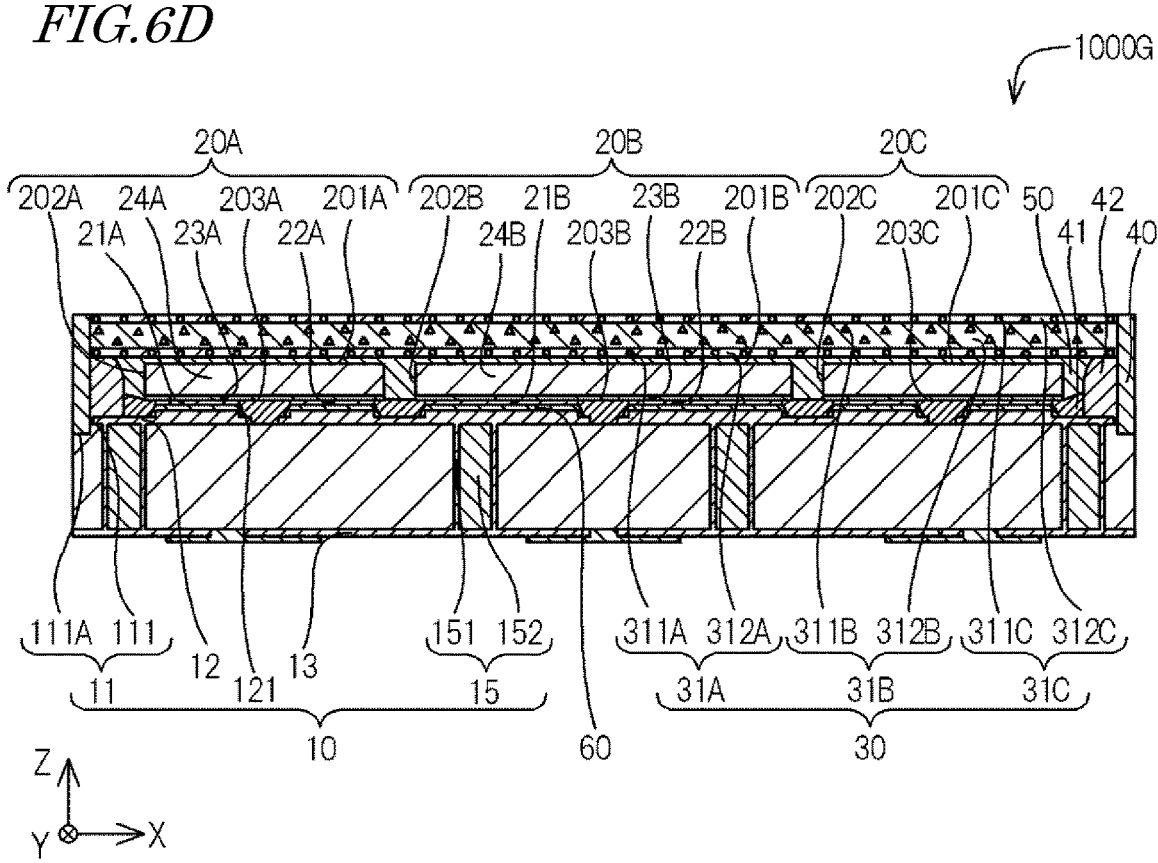
FIG. 6D is a schematic cross-sectional view of the light emitting device taken along line 6D-6D in FIG. 6C.

In the case where the substrate 10 is not included as in the light emitting device 1000F shown in FIG. 5D, it is preferable that the first light emitting element 20A and the second light emitting element 20B are connected with each other by a metal film 122 formed by sputtering or the like. The provision of the metal film 122 allows the first light emitting element 20A and the second light emitting element 20B to be electrically connected with each other.

The substrate 10 includes, for example, the base member 11 in which at least one via 15 is formed, a first wiring portion 12, and the second wiring portion 13. The base member 11 includes a front surface 111 extending in a longer direction and a shorter direction, a rear surface 112 located opposite to the front surface 111, a bottom surface 113 adjacent and perpendicular to the front surface 111, and a top surface 114 located opposite to the bottom surface 113 (see, e.g., FIG. 10). The first wiring portion 12 is located on the front surface 111 of the base member 11. The second wiring portion 13 is located on the rear surface 112 of the base member 11. The first light emitting element 20A and the second light emitting element 20B are electrically connected with, and are located on, the first wiring portion 12. The first reflective member 40 covers the first lateral surface 202A, the second lateral surface 202B and the front surface 111 of the substrate 10. The via 15 electrically connects the first wiring portions 12 and the second wiring portions 13 to each other.

As shown in FIG. 1B, the base member 11 may have at least one recessed portion 16. The recessed portion 16 is opened at the rear surface 112 and the bottom surface 113.

An inner wall of the recessed portion 16 is covered with a third wiring portion 14. In the case where the base member 11 have the recessed portion 16, the light emitting device 1000 is allowed to be secured to the mounting substrate by a joining member such as a solder member or the like formed in the recessed portion 16. This can increase the joining strength between the light emitting device and the mounting substrate. Alternatively, as in a light emitting device 1000G shown in FIG. 6A through FIG. 6D, the base member 11 does not need to have any recessed portion. In the case where the base member 11 includes no recessed portion, the strength of the base member 11 can be increased.

The light emitting device 1000 may be secured to the mounting substrate by the joining member such as a solder member or the like formed in the recessed portion 16. The number of the recessed portion 16 may be one or more. In the case where the plurality of recessed portions 16 is formed on the base member 11, the joining strength between the light emitting device 1000 and the mounting substrate can be increased. The recessed portion 16 may be a central recessed portion 16A opened on the rear surface 112 and the bottom surface 113 and apart from a shorter lateral surface 105 (FIG. 7) of the base member 11, or may be an end recessed portion 16B opened on the rear surface 112, the bottom surface 113 and the shorter lateral surface 105 of the base member 11. In this specification, the term "recessed portion" refers to the central recessed portion and/or the end recessed portion.

The recessed portion 16 may have an equal depth on the top surface 114 side and the bottom surface 113 side, or may be deeper on the bottom surface 113 side than on the top surface 114 side. In the case where as shown in FIG. 2B, the recessed portion 16 is deeper in the Z direction on the bottom surface 113 side than on the top surface 114 side, thickness W1 of a portion of the base member 11 that is located on the top surface 114 side with respect to the recessed portion 16 is greater than thickness W2 of a portion of the base member 11 that is located on the bottom surface 113 side with respect to the recessed portion 16. This can alleviate a decrease in the strength of the base member. In addition, a depth W3 of the recessed portion 16 on the bottom surface 113 side is greater than a depth W4 of the recessed portion 16 on the top surface 114 side. This can increase the volume of the joining member formed in the recessed portion 16. Therefore, the joining strength between the light emitting device 1000 and the mounting substrate can be increased. The light emitting device 1000 may be either a top emission type or side emission type. The top emission type has a structure in which the rear surface 112 of the base member 11 and the mounting substrate face each other. The side view type has a structure in which the bottom surface 113 of the base member 11 and the mounting substrate face each other. In either case, the increase in the volume of the joining member can increase the joining strength between the light emitting device 1000 and the mounting substrate.

The joining strength between the light emitting device 1000 and the mounting substrate can be increased especially in the case where the light emitting device 1000 is used as the side view type. Because the recessed portion 16 is deeper in the Z direction on the bottom surface 113 side than on the top surface 114 side, the surface area size of the opening of the recessed portion 16 at the bottom surface 113 can be made large. Because the surface area size of the opening of the recessed portion at the bottom surface, which faces the mounting substrate, is made large, the surface area size of the joining member located on the bottom surface can also be made large. In this manner, the surface area size of the joining member located on the surface facing the mounting substrate can be increased. This can increase the joining strength between the light emitting device 1000 and the mounting substrate.

It is preferable that the maximum depth of each of the recessed portions 16 in the Z direction is 0.4 to 0.9 times the thickness of the base member 11 in the Z direction. With the structure in which the depth of the recessed portion 16 is larger than 0.4 times the thickness of the base member 11, the volume of the joining member formed in the recessed portion 16 can be increased. This can increase the joining strength between the light emitting device 1000 and the mounting substrate. With the structure in which the depth of the recessed portion 16 is smaller than 0.9 times the thickness of the base member 11, the strength of the base member 11 is less likely to be decreased.

As shown in FIG. 2B, it is preferable that the recessed portion 16 includes a parallel portion 161 extending from the rear surface 112 in a direction parallel to the bottom surface 113 (in the Z direction) as seen in a cross-sectional view. The provision of the parallel portion 161 can increase the volumetric capacity of the recessed portion 16 even though the surface area size of the opening of the recessed portion 16 at the rear surface 112 is the same. With such an increased volumetric capacity of the recessed portion 16, the amount of the joining member such as a solder member or the like that may be formed in the recessed portion 16 can be increased. This can increase the joining strength between the light emitting device 1000 and the mounting substrate. In this specification, the term "parallel" indicates that a tolerance of about ±3 degrees is allowed. As seen in a cross-sectional view, the recessed portion 16 has an inclining portion 162 inclining so as to increase the thickness of the base member 11 from the bottom surface 113. The inclining portion 162 may be defined by a straight line or a curved line.

Figure 7:
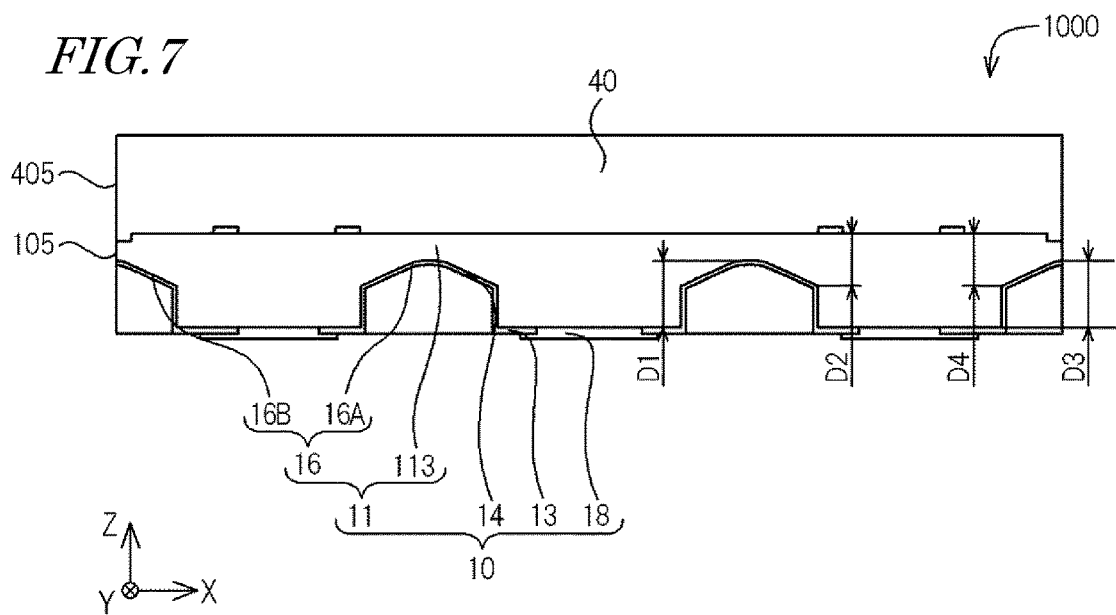
FIG. 7 is a schematic bottom view of the light emitting device in the embodiment.

At the bottom surface 113, the central recessed portion 16A may have a substantially constant depth in the Z direction, or the depth of the central recessed portion 16A may be different between in a central portion and an end portion. It is preferable that as shown in FIG. 7, at the bottom surface 113, a depth D1 of the central portion of the central recessed portion 16A is the maximum depth of the central recessed portion 16A in the Z direction. With such a structure, a thickness D2 of the base member 11 in the Z direction can be large at an end of the central recessed portion 16A in the X direction, as seen in a bottom view. This can increase the strength of the base member 11. In this specification, the term "central" indicates that a tolerance of about 5 μm is allowed.

At the bottom surface 113, the end recessed portion 16B may have a substantially constant depth in the Z direction. Alternatively, a depth D3 of the end recessed portion 16B at an end corresponding to the lateral surface 105 of the base member 11 may be larger than a depth of the end recessed portion 16B at an end not corresponding to the lateral surface 105 of the base member 11. With such a structure, thickness D4 of the base member 11 in the Z direction can be large at the end of the end recessed portion 16B not corresponding to the lateral surface 105 of the base member 11. This can increase the strength of the base member 11.

Figure 8:
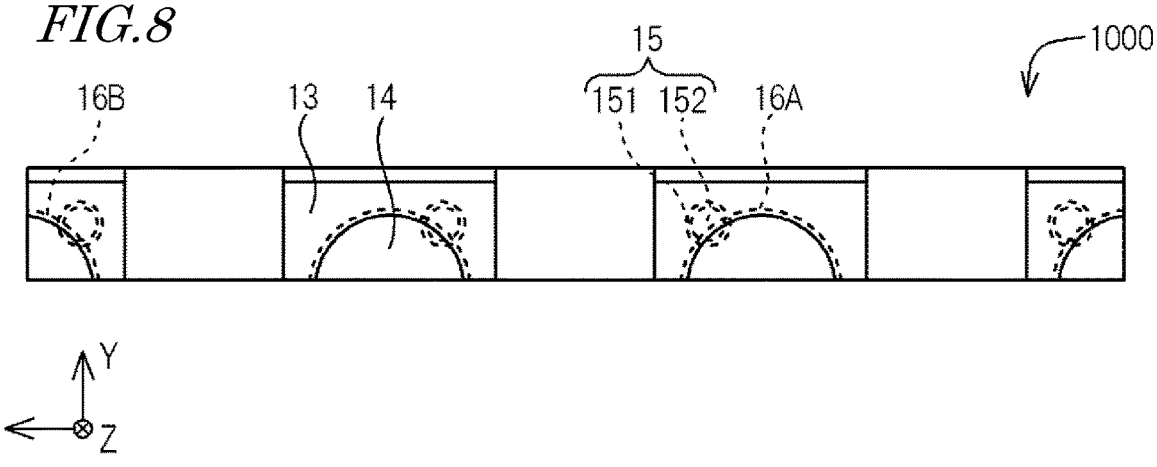
FIG. 8 is a schematic rear view of the light emitting device in the embodiment.

As shown in FIG. 8, it is preferable that the central recessed portion 16A has a substantially semicircular shape at the rear surface 112. It is preferable that the end recessed portion 16B has a shape of about ¼ of a circle at the rear surface 112. Because the shape of the recessed portion 16B at the rear surface 112 has rounded or nonangular portion, a stress is less likely to concentrate to any particular position of the recessed portion 16. This can alleviate breakage of the base member 11.

As shown in FIG. 2A, it is preferable that each of the vias 15 is in contact with corresponding ones of the first wiring portions 12, the second wiring portions 13 and the third wiring portions 14. With such a structure, heat from the light emitting elements is transmitted from the first wiring portions 12 to the second wiring portions 13 and/or the third wiring portions 14 through the vias 15. This can improve the heat dissipation of the light emitting device 1000.

The vias 15 may include a conductive member filling a through-hole of the vias formed in the base member 11. As shown in FIG. 2A, the vias 15 may each include a fourth wiring portion 151 covering an inner surface of the through-hole in the base member 11 and a filling member 152 filling a space enclosed by the fourth wiring portion 151. The filling member 152 may be conductive or insulating.

In the case where the first light emitting element 20A and/or the second light emitting element 20B is flip-chip-mounted on the substrate 10, it is preferable that the first wiring portion 12 includes at least one protrusion 121 at a position overlapping the first electrodes 21A and 22A of the first light emitting element 20A and/or the second electrodes 21B and 22B of the second light emitting element 20B as seen in a front view. With the structure in which the first wiring portion 12 includes the protrusion 121, when the first wiring portion 12 is connected with the first electrodes 21A and 22A and/or the second electrodes 21B and 22B via at least one conductive bonding member 60, the positional alignment between the substrate 10 and the first light emitting element 20A and/or the second light emitting element 20B can be easily realized by a self-alignment effect. The shape, height, size or the like of the protrusion 121 used herein is not particularly specified, but may be appropriately adjusted depending on the size of the substrate 10, the thickness of the first wiring portion 12, the size of the first light emitting element 20A and/or the second light emitting element 20B, and the like. Lateral surfaces of the protrusion 121 may be inclined or perpendicular to the rest of the first wiring portion 12. In the case where the lateral surfaces of the protrusions 121 are perpendicular to the rest of the first wiring portion 12, the first light emitting element 20A and/or the second light emitting element 20B located on the protrusions 121 is less likely to move, and thus is stably mounted. In this specification, the term "perpendicular" indicates that a tolerance of about ±3 degrees is allowed.

As shown in FIG. 7, it is preferable that a shorter lateral surface 405 of the first reflective member 40 and the shorter lateral surface 105 of the substrate 10 are substantially flush with each other. With such a structure, the width of the light emitting device in the longer direction (i.e., X direction) is shortened. Thus, the size of the light emitting device is decreased.

Figure 9:
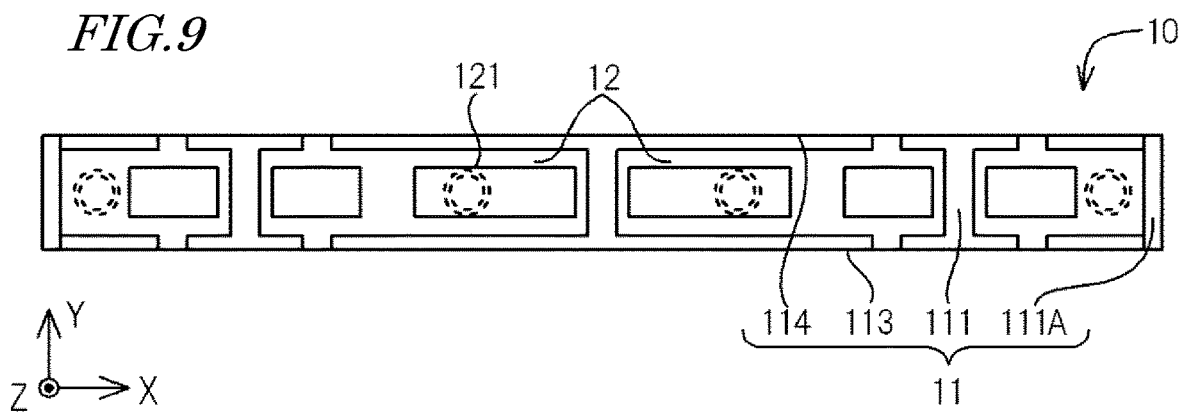
FIG. 9 is a schematic front view of a substrate of the light emitting device in the embodiment.

As shown in FIG. 2A and FIG. 9, the base member 11 may include at least one concaved portion 111A in the front surface 111. With the state where the first reflective member 40 covers the front surface 111 of the base member 11, the concaved portion 111A in the front surface 111 can increase the contact area size of the first reflective member 40 and the base member 11. This can increase the joining strength between the first reflective member 40 and the base member 11. It is preferable that the concaved portion 111A is located at both of two ends of the front surface 111 in the longer direction (i.e., X direction). Such a structure can increase the joining strength between the first reflective member 40 and the base member 11 at both of the two ends thereof. Therefore, the reflective member 40 is less likely to be delaminated from the base member.

Figure 10:
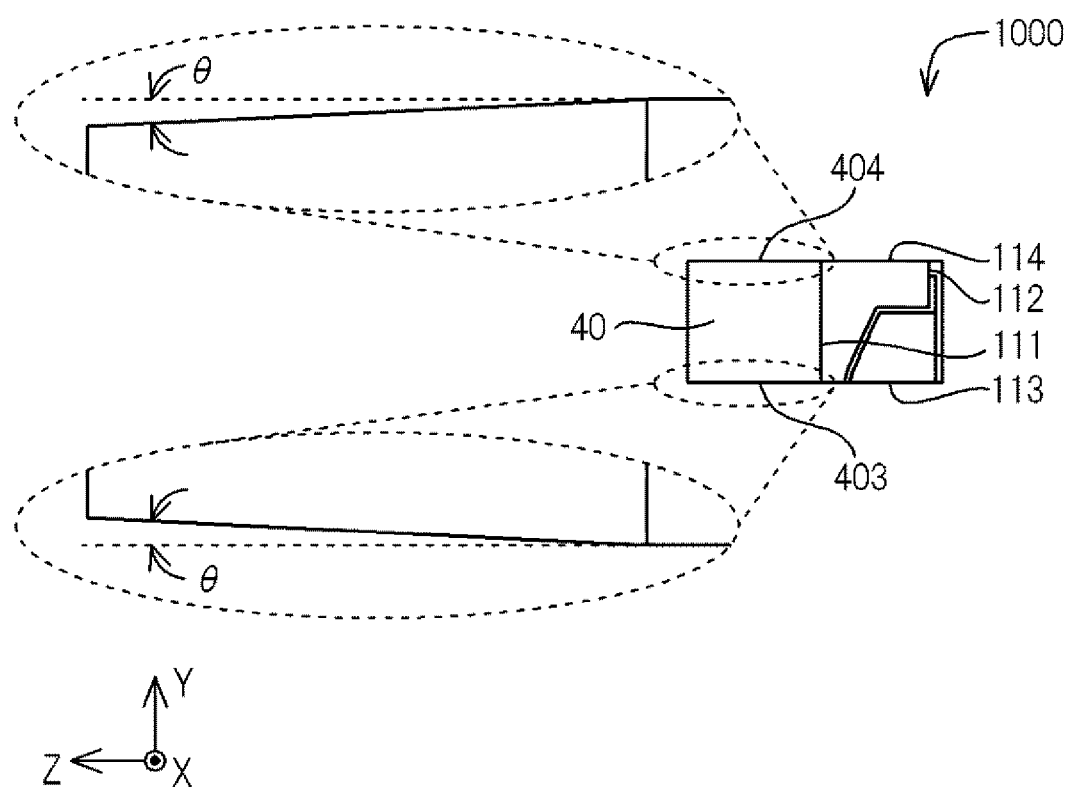
FIG. 10 is a schematic right side view of the light emitting device in the embodiment.

As shown in FIG. 10, it is preferable that a longer lateral surface 403 of the first reflective member 40 on the bottom surface 113 side is inclined inward while extending in the Z direction. With such a structure, when the light emitting device 1000 is to be mounted on the mounting substrate, the lateral surface 403 of the first reflective member 40 and the mounting substrate are less likely to be in contact each other. Therefore, the light emitting device 1000 can be easily mounted. It is preferable that a longer lateral surface 404 of the first reflective member 40 on the top surface 114 side is inclined inward while extending in the Z direction. Such a structure can alleviate the lateral surface 404 of the first reflective member 40 from being in contact with a collet (i.e., suction hole), and thus the first reflective member 40 is less likely to be damaged when the light emitting device 1000 is sucked by the collet. As described above, it is preferable that the longer lateral surface 403 of the first reflective member 40 on the bottom surface 113 side, and the longer lateral surface 404 of the first reflective member 40 on the top surface 114 side, are inclined inward in the light emitting device 1000 while extending from the rear surface 112 toward the front surface 111 while extending in the Z direction. The inclination angle θ of the first reflective member 40 may be appropriately selected. From the points of view of ease of providing the above-described effects and of the strength of the first reflective member 40, the inclination angle θ is preferably 0.3 degrees or larger and 3 degrees or smaller, more preferably 0.5 degrees or larger and 2 degrees or smaller, and still more preferably 0.7 degrees or larger and 1.5 degrees or smaller. It is preferable that a right side of lateral surfaces and a left side of lateral surfaces of the light emitting device 1000 have substantially the same shape as each other. With such a structure, the size of the light emitting device 1000 can be reduced.

Hereinafter, components of the light emitting device in an embodiment according to the present disclosure will be described. Light Emitting Element (first light emitting element, second light emitting element, third light emitting element and/or fourth light emitting element)

The "light emitting element" refers to the first light emitting element, the second light emitting element, the third light emitting element and/or the fourth light emitting element. The light emitting element is a semiconductor element that itself emits light when being applied with a voltage. For the light emitting element, a known semiconductor element formed of a nitride semiconductor or the like can be used. The light emitting element may be, for example, an LED chip. The light emitting element includes at least a semiconductor stack body, and in many cases, further includes a substrate (hereinafter referred to as an "element substrate"). The semiconductor stack body may have a quadrangular shape, specifically, a square shape or a rectangular shape longer in one direction, when seen in a plan view. Alternatively, the semiconductor stack body may have other shapes, for example, a hexagonal shape. In the case where the semiconductor stack body has a hexagonal shape, the light emission efficiency can be improved. A lateral surfaces of the light emitting element may be perpendicular to the top surface, or inclined inward or outward with respect to the top surface. The light emitting element includes positive and negative electrodes. The positive and negative electrodes may be formed of gold, silver, tin, platinum, rhodium, titanium, aluminum, tungsten, palladium, nickel or an alloy thereof. The emission peak wavelength of the light emitting element may be selected from a range of an ultraviolet region to an infrared region depending on the type of the semiconductor material or the mixed crystal ratios of materials. A preferable material for the semiconductor stack body may be a nitride semiconductor, which may emit light of a short wavelength that excites wavelength conversion particles at a high efficiency. The nitride semiconductor is generally expressed by general formula $In_xAl_yGa_{1-x-y}N$ ($0 \le x$, $0 \le y$, $x+y \le 1$). Other examples of usable semiconductor material include an InAlGaAs-based semiconductor, an InAlGaP-based semiconductor, zinc sulfide, zinc selenide, silicon carbide and the like. The element substrate of the light emitting element is generally a substrate for crystal growth, from which a semiconductor crystal forming the semiconductor stack layer may grow. Alternatively, the element substrate may be a support substrate which supports the semiconductor element structure that has been separated from the substrate for crystal growth. The element substrate may be light-transmissive, thereby enabling flip-chip mounting and exhibition of improved light extraction efficiency. The element substrate may be a substrate mainly containing sapphire, gallium nitride, aluminum nitride, silicon, silicon carbide, gallium arsenide, gallium phosphide, indium phosphide, zinc sulfide, zinc oxide, zinc selenide, diamond or the like. Among these materials, sapphire is preferable. The thickness of the element substrate may be appropriately selected, and is, for example, 0.02 mm or greater and 1 mm or less. From the point of view of the strength of the element substrate and/or the thickness of the light emitting device, it is preferred that the thickness of the element substrate is 0.05 mm or greater and 0.3 mm or less.

Light-Transmissive Member 30

The light-transmissive member is provided on or above the light emitting element, and protects the light emitting element. The light-transmissive member includes the first light-transmissive layer, the wavelength conversion layer and the second light-transmissive layer provided in a stacked manner. The first light-transmissive layer contains the first matrix and the first diffusive particles. The wavelength conversion layer contains the second matrix and the wavelength conversion particles. The second light-transmissive layer contains the third matrix and the second diffusive particles.

Matrix of Light-Transmissive Member (First Matrix, Second Matrix and/or Third Matrix)

The "matrix of the light-transmissive member" refers to the first matrix, the second matrix and/or the third matrix. The matrix of the light-transmissive member may be formed of any material that is transmissive to light emitted by the light emitting element. The term "light-transmissive" refers to having a light transmittance of 60% or higher, preferably 70% or higher, and more preferably 80% or higher, respectively at the emission peak wavelength of the light emitting element. The matrix of the light-transmissive member may be formed of a silicone resin, an epoxy resin, a phenol resin, a polycarbonate resin, an acrylic resin, or a modified resin thereof. Alternatively, the matrix of the light-transmissive member may be formed of glass. Among these materials, a silicone resin and a modified silicone resin, which are highly resistant against heat and light, are preferable. Examples of the silicone resin include dimethyl silicone resin, phenylmethyl silicone resin, and diphenyl silicone resin. In this specification, the term "modified resin" encompasses a hybrid resin.

Diffusive Particles of Light-Transmissive Member (First Diffusive Particles and/or Second Diffusive Particles)

The "diffusive particles of the light-transmissive member" refers to the first diffusive particles and/or the second diffusive particles. The diffusive particles of the light-transmissive member may be formed of titanium oxide, silicon oxide, aluminum oxide, zirconium oxide, zinc oxide or the like. The first diffusive particles and the second diffusive particles may be formed of the same material as, or different materials from, each other. For example, the second diffusive particles may be formed of a material having a refractive index lower than that of the material of the first diffusive particles. In this case, the amount of light diffused by the second diffusive particles is decreased, and thus the light extraction efficiency of the light emitting device can be improved. To realize such a refractive index relationship between the first diffusive particles and the second diffusive particles, the first diffusive particles can be formed of titanium oxide, and the second diffusive particles can be formed of silicon oxide. The diffusive particles contained in the matrix may be of a single material or of a combination of two or more materials. The wavelength conversion layer may contain the diffusive particles. With a structure in which the wavelength conversion layer includes the diffusive particles, the light emitted by the light emitting element is diffused in the wavelength conversion layer. This can decrease the amount of the wavelength conversion particles to be used. The diffusive particles have size of, for example, about 0.1 µm or longer and about 3 µm of shorter on average. In this specification, the "particle size" is defined by, for example, $D_{50}$ (i.e., median for a volume distribution).

Wavelength Conversion Particles

The wavelength conversion particles absorb at least a part of primary light emitted by the light emitting element and emit secondary light having a wavelength different from that of the primary light. The wavelength conversion particles may comprise one material or a combination of two or more materials among the examples shown below.

Examples of materials of the wavelength conversion particles emitting green light include a yttrium-aluminum-garnet-based phosphor (e.g., $Y_3(Al, Ga)_5O_{12}:Ce$), a lutetium-aluminum-garnet-based phosphor (e.g., $Lu_3(Al, Ga)_5O_{12}:Ce$), a terbium-aluminum-garnet-based phosphor (e.g., $Tb_3(Al, Ga)_5O_{12}:Ce$), a silicate-based phosphor (e.g., $(Ba, Sr)_2SiO_4:Eu$), a chlorosilicate-based phosphor (e.g., $Ca_8Mg(SiO_4)_4Cl_2:Eu$), a β-SiAlON-based phosphor (e.g., $Si_{6-z}Al_zO_zN_{8-z}:Eu$ ($0<z<4.2$)), an SGS-based phosphor (e.g., $SrGa_2S_4:Eu$), and the like. Examples of materials of the wavelength conversion particles emitting yellow light include an α-SiAlON-based phosphor (e.g., $M_z(Si, Al)_{12}(O/N)_{16}$ ($0 \le z \le 2$; M is Li, Mg, Ca, Y, or a lanthanide element excluding La and Ce), and the like. The above-described examples of material of the wavelength conversion particles emitting green light include a material usable as the wavelength conversion particles emitting yellow light. For example, the emission peak wavelength is shifted toward the longer side so as to emit yellow light by substituting Gd for a part of Y in the yttrium-aluminum-garnet-based phosphor. The above-described examples of material of the wavelength conversion particles emitting yellow light include a material usable as wavelength conversion particles emitting orange light. Examples of materials of the wavelength conversion particles emitting red light include a nitrogen-containing calcium aluminosilicate (e.g., CASN or SCASN)-based phosphor, for example, $(Sr, Ca)AlSiN_3:Eu$, and the like. Another example of material of the wavelength conversion particles emitting red light may be a manganese-activated fluoride-based phosphor (phosphor represented by general formula (I): $A_2[M_{1-a}Mn_aF_6]$ (in general formula (I), A is at least one selected from the group consisting of K, Li, Na, Rb, Cs and $NH_4$; M is at least one element selected from the group consisting of the group IV elements and the group XIV elements; and "a" satisfies 0<a<0.2)). A representative example of the manganese-activated fluoride-based phosphor is a phosphor of manganese-activated potassium fluorosilicate (e.g., $K_2SiF_6$:Mn).

Reflective Member (First Reflective Member, Second Reflective Member and/or Third Reflective Member)

The "reflective member" refers to the first reflective member, the second reflective member and/or the third reflective member. From the point of view of the light extraction efficiency in the Z direction, the reflective member has a light reflectance of preferably 70% or higher, more preferably 80% or higher, and still more preferably 90% or higher, respectively at the emission peak wavelength of the light emitting element. It is also preferable that the reflective member is white. Therefore, it is preferable that the reflective member contains a white pigment in the matrix. The reflective member is put into a liquid state before being cured. The reflective member may be formed by transfer molding, injection molding, compressing molding, potting or the like. In the case where the light emitting device includes the first reflective member, the second reflective member and/or the third reflective member, the third reflective member may be formed by drawing whereas the first reflective member and the second reflective member may be formed by potting, for example.

Matrix of Reflective Member

The matrix of the reflective member may be formed of a resin, for example, a silicone resin, an epoxy resin, a phenol resin, a polycarbonate resin, an acrylic resin or a modified resin thereof. Among these resins, a silicone resin and a modified silicone resin, which are highly resistant against heat and light, are preferable. Examples of the silicone resin include dimethyl silicone resin, phenyl-methyl silicone resin, and diphenyl silicone resin.

White Pigment

The white pigment may be formed of a single material or a combination of two or more materials selected from the group consisting of titanium oxide, zinc oxide, magnesium oxide, magnesium carbonate, magnesium hydroxide, calcium carbonate, calcium hydroxide, calcium silicate, magnesium silicate, barium titanate, barium sulfate, aluminum hydroxide, aluminum oxide, zirconium oxide and silicon oxide. The white pigment may have an appropriate shape, and may be irregular or crushed. It is preferable that the white pigment is spherical from the point of view of the fluidity. The white pigment may have an average particle size of, for example, about 0.1 μm or longer and about 0.5 μm or shorter. It is preferable that the white pigment is as small as possible in order to improve the effects of light reflection and covering. The content of the white pigment in the light-reflective member may be of any appropriate value, and is, for example, preferably 10 wt. % or higher and 80 wt. % or lower, more preferably 20 wt. % or higher and 70 wt. % or lower, and still more preferably 30 wt. % or higher and 60 wt. % or lower, from the points of view of the light reflectance, the viscosity in a liquid state and the like. The term "wt. %" herein refers to percent by weight, and represents the weight ratio of a material of interest with respect to the total weight of the light-reflective member.

Light Guide Member 50

The light guide member bonds the light emitting element and the light-transmissive member to each other, and guides the light from the light emitting element to the light-transmissive member. The matrix of the light guide member may be formed of a silicone resin, an epoxy resin, a phenol resin, a polycarbonate resin, an acrylic resin or a modified resin thereof. Among these resins, a silicone resin and a modified silicone resin, which are highly resistant against heat and light, are preferable. Examples of the silicone resin include dimethyl silicone resin, phenyl-methyl silicone resin, and diphenyl silicone resin. In the matrix of the light guide member, diffusive particles the same as or similar to those in the above-described light-transmissive member may be contained.

Cover Member

The cover member covers the light extraction surface of the light emitting element (i.e., the first light extraction surface, the second light extraction surface and/or the third light extraction surface), and diffuses the light from the light emitting element or converts the light from the light emitting element into light having an emission peak wavelength different from that of the light from the light emitting element.

Matrix of Cover Member

The matrix of the cover member may be formed of a material the same as or similar to that of the matrix of the light-transmissive member.

Diffusive Particles of Cover Member

The "diffusive particles of the cover member" refers to the third diffusive particles. The diffusive particles of the cover member may be formed of a material the same as or similar to that of the diffusive particles of the light-transmissive member.

Substrate 10

The substrate 10 is a component on which the light emitting element is placed. The substrate 10 includes, for example, the base member 11, the first wiring portion 12, the second wiring portion 13, and the vias 15. In the case where the base member 11 has at least one recessed portion, the substrate 10 may include the at least one third wiring portion 14 covering the inner wall of the recessed portion.

Base Member 11

The base member 11 may be formed of an insulating material such as a resin, a ceramic material, glass or the like. Examples of the resin includes epoxy, bismaleimide triazine (BT), polyimide, and the like. The base member 11 may be formed of a fiberglass-reinforced plastic (e.g., glass epoxy resin). Examples of the ceramic material include aluminum oxide, aluminum nitride, zirconium oxide, zirconium nitride, titanium oxide, titanium nitride, a mixture thereof, and the like. Among these materials, it is preferable to use, especially, a material having a coefficient of linear thermal expansion close to that of the light emitting element. The lower limit of the thickness of the base member 11 may be appropriate selected. From the point of view of the strength of the base member 11, the thickness of the base member 11 is preferably 0.05 mm or greater, and more preferably 0.2 mm or greater. From the point of view of the thickness (i.e., depth in the Z direction) of the light emitting device, the thickness of the base member 11 is preferably 0.5 mm or less, and more preferably 0.4 mm or less.

First Wiring Portion 12, Second Wiring Portion 13, Third Wiring Portion 14)

The at least one first wiring portion is located on the front surface of the substrate, and is electrically connected with the at least one light emitting element. The at least one second wiring portion is located on the rear surface of the substrate, and is electrically connected with the first wiring portion through the via. The at least one third wiring portion covers the inner wall of the recessed portion, and is electrically connected with the second wiring portion. The first wiring portion, the second wiring portion and the third wiring portion may be formed of material comprising copper, iron, nickel, tungsten, chromium, aluminum, silver, gold, titanium, palladium, rhodium, or an alloy thereof. The first wiring portion, the second wiring portion and the third wiring portion may each be formed of a single layer or a plurality of layers of any of the above-listed metal materials and alloys. From the point of view of, especially, the heat dissipation, it is preferable to use copper or a copper alloy. The first wiring portion and/or the second wiring portion may include a surface layer of silver, platinum, aluminum, rhodium, gold or an alloy thereof from the point of view of, for example, the wettability on the conductive bonding member and/or the light reflectance.

Via 15

The at least one via 15 is provided in the through-hole extending from the front surface to the rear surface of the base member 11, and electrically connects the first wiring portion and the second wiring portion to each other. The via 15 may include the fourth wiring portion 151 covering the inner surface of the through-hole in the base member and a filling member 152 filling a space enclosed by the fourth wiring portion 151. The fourth wiring portion 151 may be formed of a conductive material the same as or similar to that of the first wiring portion, the second wiring portion and the third wiring portion. The filling member 152 may be formed of a conductive material or an insulating material.

Insulating Film 18

The insulating film 18 ensures insulation at the rear surface of the light emitting device and prevention of short-circuiting of the light emitting device. The insulating film may be formed of a material that is used in the field. The insulating film may be formed of, for example, a thermosetting resin, a thermoplastic resin or the like.

Conductive Bonding Member 60

The conductive bonding member electrically connects the electrodes of the light emitting element and the first wiring portion to each other. The conductive bonding member may be any one of: bumps mainly containing gold, silver, copper or the like; metal pastes containing metal powder of silver, gold, copper, platinum, aluminum, palladium or the like and a resin binder; solder based on tin-bismuth, tin-copper, tin-silver, gold-tin or the like; and brazing material of a low melting-point metal material; and the like.

A light emitting device in an embodiment according to the present disclosure can be used for, for example, backlight devices of liquid crystal display devices; various lighting devices; large-scale displays; various display devices for advertisements, destination guides and the like; projector devices; and image reading devices for digital video cameras, facsimiles, copiers, scanners and the like.

While the present invention has been described with respect to exemplary embodiments thereof, it will be apparent to those skilled in the art that the disclosed invention may be modified in numerous ways and may assume many embodiments other than those specifically described above. Accordingly, it is intended by the appended claims to cover all modifications of the invention that fall within the true spirit and scope of the invention.

What is claimed is:

1. A light emitting device, comprising:
a first light emitting element including a rectangular first light extraction surface, a first electrodes formation surface located opposite to the first light extraction surface, a first lateral surface located between the first light extraction surface and the first electrodes formation surface, and a pair of first electrodes formed on the first electrodes formation surface;
a second light emitting element including a rectangular second light extraction surface, a second electrodes formation surface located opposite to the second light extraction surface, a second lateral surface located between the second light extraction surface and the second electrodes formation surface, and a pair of second electrodes formed on the second electrodes formation surface, the second light emitting element emitting light having an emission peak wavelength different from an emission peak wavelength of the first light emitting element, a shorter side of the first light extraction surface and a shorter side of the second light extraction surface facing each other;
a light guide member continuously covering the first light extraction surface, the first lateral surface, the second light extraction surface and the second lateral surface;
a light-transmissive member covering the first light extraction surface and the second light extraction surface via the light guide member; and
a first reflective member covering the first lateral surface and the second lateral surface via the light guide member;
wherein:
the light-transmissive member includes a first light-transmissive layer facing the first light extraction surface and the second light extraction surface, a wavelength conversion layer located on the first light-transmissive layer, and a second light-transmissive layer located on the wavelength conversion layer;
the first light-transmissive layer contains a first matrix and first diffusive particles;
the wavelength conversion layer contains a second matrix and wavelength conversion particles; and
the second light-transmissive layer contains a third matrix and second diffusive particles.

2. The light emitting device of claim 1, wherein the first light-transmissive layer, the second light-transmissive layer and the light guide member are substantially free of a wavelength conversion particle.

3. The light emitting device of claim 1, wherein the first light emitting element emits light having an emission peak wavelength of 430 nm or longer and shorter than 490 nm, and the second light emitting element emits light having an emission peak wavelength of 490 nm or longer and 570 nm or shorter.

4. The light emitting device of claim 3, wherein the wavelength conversion particles emit light having an emission peak wavelength of 580 nm or longer and shorter than 680 nm.

5. The light emitting device of claim 1, wherein the wavelength conversion particles contain a manganese-activated fluoride phosphor.

6. The light emitting device of claim 1, wherein the first matrix, the second matrix and the third matrix contain the same resin material as each other.

7. The light emitting device of claim 1, further comprising a first cover member containing third diffusive particles, the first cover member covering the second light extraction surface.

8. The light emitting device of claim 1, further comprising a second reflective member covering the first electrodes formation surface and the second electrodes formation surface.

9. The light emitting device of claim 1, further comprising a third reflective member provided between the light guide member and the first reflective member.

10. The light emitting device of claim 1, further comprising a substrate on which the first light emitting element and the second light emitting element are placed.

11. The light emitting device of claim 1, further comprising a third light emitting element including a third light extraction surface, a third electrodes formation surface located opposite to the third light extraction surface, a third lateral surface located between the third light extraction surface and the third electrodes formation surface, and a pair of third electrodes formed on the third electrodes formation surface;
wherein:
the light guide member continuously covers the third light extraction surface and the third lateral surface;
the light-transmissive member covers the third light extraction surface via the light guide member; and
the first reflective member covers the third lateral surface via the light guide member.

12. The light emitting device of claim 11, wherein the second light emitting element is located between the first light emitting element and the third light emitting element as seen in a front view.

13. The light emitting device of claim 11, wherein the third light emitting element emits light having an emission peak wavelength same as the emission peak wavelength of the first light emitting element.

14. The light emitting device of claim 2, wherein the first light emitting element emits light having an emission peak wavelength of 430 nm or longer and shorter than 490 nm, and the second light emitting element emits light having an emission peak wavelength of 490 nm or longer and 570 nm or shorter.

15. The light emitting device of claim 12, wherein the third light emitting element emits light having an emission peak wavelength same as the emission peak wavelength of the first light emitting element.

\* \* \* \* \*